(12) United States Patent  (10) Patent No.: US 6,706,412 B2
Yializis  (45) Date of Patent: Mar. 16, 2004

(54) BARRIER FILM FOR LIMITING TRANSMISSION OF OXYGEN AND MOISTURE THERETHROUGH

(75) Inventor: Angelo Yializis, Tucson, AZ (US)

(73) Assignee: Sigma Laboratories of Arizona, Tucson, AZ (US)

( * ) Notice: Subject to any disclaimer, the term of this patent is extended or adjusted under 35 U.S.C. 154(b) by 172 days.

(21) Appl. No.: 09/792,196

(22) Filed: Feb. 21, 2001

(65) Prior Publication Data

US 2003/0068459 A1 Apr. 10, 2003

Related U.S. Application Data

(60) Division of application No. 09/169,175, filed on Oct. 8, 1998, now Pat. No. 6,214,422, which is a division of application No. 08/628,570, filed on Apr. 4, 1996, now Pat. No. 6,083,628, which is a continuation-in-part of application No. 08/334,739, filed on Nov. 4, 1994, now abandoned.

(51) Int. Cl.⁷ ................................................ B32B 15/08
(52) U.S. Cl. ...................... 428/463; 428/461; 428/522; 428/626; 428/627
(58) Field of Search ................ 428/457, 463, 428/473.5, 461, 515, 519, 521, 626, 627, 520, 522; 427/595, 487, 597, 596, 496, 497, 505, 404, 535, 536, 537, 250

(56) References Cited

U.S. PATENT DOCUMENTS

| 4,557,980 A | 12/1985 | Hodnett | 428/336 |
| 4,740,385 A | 4/1988 | Feuerstein et al. | 427/38 |
| 4,812,351 A | 3/1989 | Okita et al. | 428/141 |
| 4,842,893 A | 6/1989 | Yializis et al. | 427/44 |
| 4,954,371 A | 9/1990 | Yializis | 427/44 |
| 5,019,210 A | 5/1991 | Chou et al. | 156/643 |
| 5,032,461 A | 7/1991 | Shaw et al. | 428/461 |
| 5,087,476 A | 2/1992 | Tohma et al. | 427/35 |
| 5,225,272 A | 7/1993 | Poole et al. | 428/323 |
| 5,270,137 A | 12/1993 | Kubota | 429/249 |
| 5,322,737 A | 6/1994 | Morra et al. | 428/412 |
| 5,374,483 A | 12/1994 | Wright | 428/412 |
| 5,445,871 A | 8/1995 | Murase et al. | 428/215 |
| 6,231,939 B1 * | 5/2001 | Shaw et al. | 428/35.9 |

FOREIGN PATENT DOCUMENTS

| EP | 0339844 A | 11/1989 |
| EP | 375215 A | 6/1990 |
| JP | 62132940 A | 6/1987 |
| JP | 404152553 A | 5/1992 |

* cited by examiner

Primary Examiner—D. S. Nakarani
(74) Attorney, Agent, or Firm—Lawrence R. Oremland, P.C.

(57) ABSTRACT

A hybrid film, comprising a first polymer film having a plasma-treated surface and a second polymer film having first and second surfaces, with the first surface of the second polymer film being disposed along the first plasma-treated surface of the first polymer film, has superior thermal and mechanical properties that improve performance in a number of applications, including food packaging, thin film metallized and foil capacitors, metal evaporated magnetic tapes, flexible electrical cables, and decorative and optically variable films. One or more metal layers may be deposited on either the plasma-treated surface of the substrate and/or the radiation-cured acrylate polymer. A ceramic layer may be deposited on the radiation-cured acrylate polymer to provide an oxygen and moisture barrier film. The hybrid film is produced using a high speed, vacuum polymer deposition process that is capable of forming thin, uniform, high temperature, cross-linked acrylate polymers on specific thermoplastic or thermoset films. Radiation curing is employed to cross-link the acrylate monomer. The hybrid film can be produced in-line with the metallization or ceramic coating process, in the same vacuum chamber and with minimal additional cost.

17 Claims, 4 Drawing Sheets

BARRIER FILM FOR LIMITING TRANSMISSION OF OXYGEN AND MOISTURE THERETHROUGH

CROSS-REFERENCE TO RELATED APPLICATION

The present application is a divisional of application Ser. No. 09/169,175, filed Oct. 8, 1998, now U.S. Pat. No. 6,214,422, which is a divisional of application Ser. No. 08/628,570, filed Apr. 4, 1996, now U.S. Pat. No. 6,083,628, issued Jul. 4, 2000, which in turn is a continuation-in-part application of Ser. No. 08/334,739, filed Nov. 4, 1994, now abandoned.

TECHNICAL FIELD

The present invention relates generally to thin metallized and non-metallized polymer films that incorporate additional coatings and surface functionalization, which impart application specific properties such as improved thermal stability, abrasion resistance, moisture barrier and optical effects, that make these films useful in food packaging applications, electrical applications that include film capacitors and cables, metal evaporated magnetic tapes, printing, decorative wraps and optically variable films for security applications.

BACKGROUND ART

Metallized and non-metallized films are commonly used in a variety of electrical, packaging and decorative applications. Although the application field is quite broad, the desired properties of the different films are basically the same. These desired properties include mechanical strength, thermal and chemical resistance, abrasion resistance, moisture and oxygen barrier, and surface functionality that aids wetting, adhesion, slippage, etc. As a result, a multitude of hybrid films have been developed to service a wide range of applications.

In general, hybrid metallized and polymer coated films utilize a variety of production methods. For example metallized polymer films are usually corona-, flame-, or plasma-treated, to promote adhesion of the metal to the polymer surface (U.S. Pat. Nos. 5,019,210 and 4,740,385); or ion beam-treated and subsequently electron beam-charged to promote adhesion and flattening of the film onto a substrate by electrostatic force (U.S. Pat. No. 5,087,476). Polymer coatings that serve various functions such as printability, adhesion promotion, abrasion resistance, optical and electrical properties, have been produced using various techniques that include thermal cure, reactive polymerization, plasma polymerization (U.S. Pat. No. 5,322,737), and radiation-curing using ultra-violet and electron beam radiation (U.S. Pat. Nos. 5,374,483; 5,445,871; 4,557,980; 5,225,272; 5,068,145; 4,670,340; 4,720,421; 4,781,965; 4,812,351; 4,67,083; and 5,085,911). In such applications, a monomer material is applied using conventional techniques of roll coating, casting, spraying, etc., and the coating is subsequently polymerized under atmospheric pressure conditions.

More recently, a new technique has been developed that allows the formation of radiation-curable coatings in the vacuum using a flash evaporation technique that leads to the formation of a vapor-deposited thin liquid monomer which can be radiation-cured (U.S. Pat. Nos. 4,842,893; 4,954,371; and 5,032,461 and European Patent Application 0 339 844). This technique overcomes the limitations of conventional techniques for applying the liquid monomers and requires relatively low doses of radiation for polymerization.

The vacuum polymer coating technique as described in the above references was found to have some critical limitations on certain mechanical, thermal, chemical and morphological properties that can reduce their usefulness in packaging films, capacitors, metal evaporated magnetic tapes and optically variable films. The invention disclosed herein overcomes these problems and extends the one-step polymer and metal vacuum coating technique to new functional products with a unique set of properties.

DISCLOSURE OF INVENTION

It is an object of the present invention to produce a hybrid polymer film that has superior mechanical, thermal, chemical and surface morphological properties. In conjunction with one or more metal coatings or a ceramic coating, the hybrid film can be used to produce improved packaging films, film capacitors, metal evaporated magnetic tapes and optically variable films.

It is also an object of this invention to produce hybrid films with controlled surface microroughness. This includes films that have a flatter surface than that of the base film, or a surface with controlled microroughness.

It is another object of the invention to provide an improved process for applying, polymerizing, and discharging, one or more layers of vacuum-deposited radiation-curable monomer films that are used to produce the hybrid polymer film in a one-step continuous process.

In accordance with the present invention, a hybrid polymer film comprises a first polymer film having a plasma-treated surface and a second polymer film having first and second surfaces, the first surface of the second polymer film being disposed along the first plasma-treated surface of the first polymer film.

The base, or first polymer, films used in the invention to produce the hybrid films are chosen from a group of thermoplastic films that include polypropylene, polyethylene terephthalate, high and low density polyethylene, polycarbonate, polyethylene-2,6-naphthalate, nylon, polyvinylidene difluoride, polyphenylene oxide, and polyphenylene sulfide, and thermoset films that include cellulose derivatives, polyimide, polyimide benzoxazole, and polybenzoaxozole. The second polymer films are radiation-polymerized monomer films that are multifunctional acrylate or acrylated monomers that contain double bonds capable of radical polymerization. Plasma treatment with gases from the group of $N_2$, Ar, Ne, $O_2$, $CO_2$, and $CF_4$ is used to functionalize the base film, to further improve the cross-linking of the acrylate film surface, and to remove surface charge, which improves winding and unwinding of the hybrid film. Inorganic layers may be used in combination with the polymer layers to produce different end use hybrid films; such inorganic layers include metals selected from the group consisting of aluminum, zinc, nickel, cobalt, iron, iron on aluminum, zinc on silver, zinc on copper, and zinc on aluminum, nickel-cobalt alloys, and nickel-cobalt-iron alloys, and ceramics selected from the group consisting of aluminum oxide, silicon oxides ($SiO_x$, where x=1 to 2), tantalum oxide, aluminum nitride, titanium nitride, silicon nitride, silicon oxynitride, zinc oxide, indium oxide, and indium tin oxide.

The hybrid polymer film evidences both improved corrosion resistance and current carrying ability of metallized capacitors compared to prior art polymer films and overall reliability in demanding applications that require operations in extreme conditions of voltage current and temperature.

As incorporated in food packaging, the presence of the acrylate polymer on a thermoplastic polymer such as polypropylene improves the oxygen and moisture barrier of metallized and ceramic coated films, and it also improves the mechanical properties of the barrier layer to the extent that there is less damage of the barrier layer as a function of film elongation.

By adjusting the chemistry of the acrylate coatings, the surface of the hybrid films can be made hydrophobic/philic, oliophobic/philic and combinations thereof. This can accommodate different printing inks for packaging film applications in addition to the improvement of barrier properties. Such metallized printable film produced in a one-step process eliminates the lamination of an additional polymer film that is used to protect the metal layer and provide a printable surface.

The hybrid films can have reduced surface microroughness, thus eliminating the need for costly flat films for magnetic tape applications. Increased and controlled surface microroughness on a hybrid film can result in lesser abrasion damage and the formation of unique interference effects cause color shifts with changing viewing angle.

As incorporated in electrical flexible cables, fluorinated acrylate polymers deposited on such thermoset polymer films as polyimide, polyimide benzoxazole (PIBO), and polybenzoaxozole (PBO), prevent electrical tracking, and only carbonize in the presence of electrical arcing.

Color shifting effects useful in decorative and security applications can be produced in a one-step low cost process by proper choice of the thickness of the metal and polymer layers.

BEST MODES FOR CARRYING OUT THE INVENTION

The vacuum polymer coating technique as described in U.S. Pat. Nos. 4,842,893; 4,954,371; and 5,032,461 and European Patent Application 0 339 844 was found to have some critical limitations that include the following: (a) when an acrylate monomer material is deposited on a polymer film substrate, adsorbed oxygen on the surface of the film scavenges radiation induced free radicals and inhibits the polymerization process in the interface area; (b) contaminants and low molecular weight species on the surface of most polymer materials can inhibit the wetting of the vapor deposited liquid monomer, resulting in thin polymer films with poor uniformity; (c) when this process is used to produce coatings on a polymer web that is moving at high speed, the polymer coating does not always reach 100% polymerization; and (d) when electron radiation is used to cure the acrylate monomers, electrons trapped on the surface of the film cause electrostatic charging. The combination of partial cure and electrostatic charge (trapped electrons) on the film surface, can cause the film to block or stick to itself when it is wound into a roll.

The discussion below is directed in the main to a hybrid film comprising polypropylene (PP) coated with a vacuum-deposited, radiation-curable acrylate monomer film that is polymerized upon curing. However, it will be understood that this discussion is exemplary only, and is not intended to be limiting to the composition of the coated polymer or to the presence or absence of a metal coating on the hybrid film.

The hybrid film comprises PP film coated with a high temperature, cross-linked, acrylate polymer, deposited by a high speed vacuum process. The basic aspects of the process are disclosed in U.S. Pat. Nos. 4,842,893; 4,954,371; and 5,032,461. However, that process is modified for the purposes of the present invention.

Figure 1:
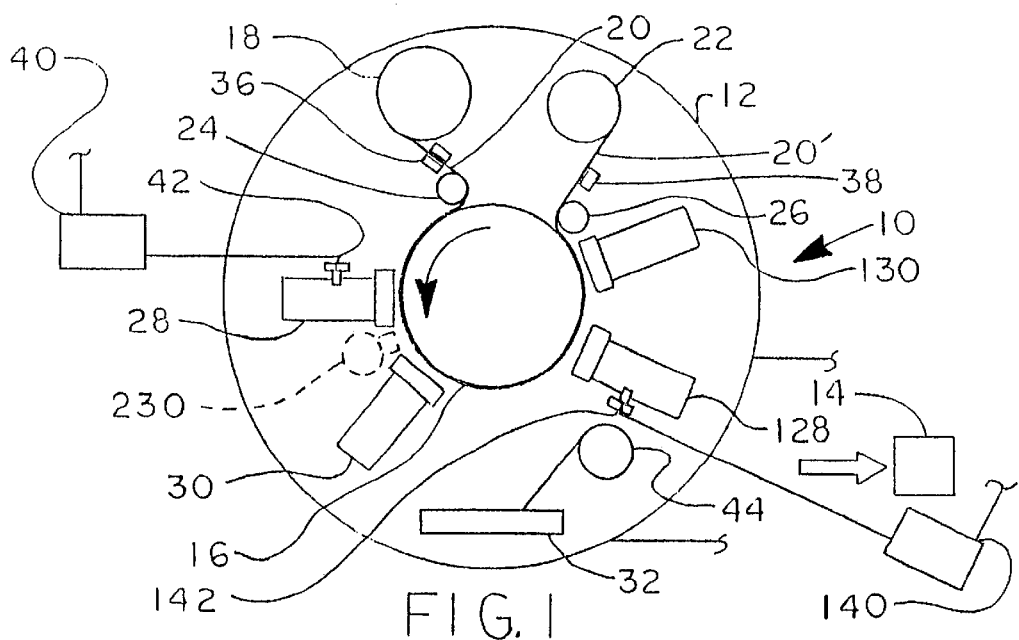
FIG. 1 is a schematic of apparatus useful for carrying out the process of the invention.

FIG. 1 depicts an example of apparatus 10 suitably employed in the practice of the present invention. A vacuum chamber 12 is connected to a vacuum pump 14, which evacuates the chamber to the appropriate pressure. The essential components of the apparatus 10 within the vacuum chamber 12 include a rotating drum 16, a source spool 18 of polymer film 20, a take-up spool 22 for winding the coated polymer film 20', suitable guide rollers 24, 26, a monomer evaporator 28 for depositing a thin film of an acrylate monomer or mixture containing an acrylate monomer on the polymer film, and radiation curing means 30, such as an electron beam gun, for cross-linking the acrylate monomer to form a radiation-cured acrylate polymer.

Optionally, an evaporation system 32 for depositing an inorganic film on the acrylate film may be employed. Also optionally, a second monomer evaporator 128 and radiation curing means 130 may be situated after the resistive evaporation system 32. These optional aspects are discussed in greater detail below.

The vacuum employed in the practice of the invention is less than about 0.001 atmosphere, or less than about 1 millibar. Typically, the vacuum is on the order of $2\times10^{-4}$ to $2\times10^{-5}$ Torr.

In operation, the polymer film 20 is fed from the source spool 18 onto the rotating drum 16, which rotates in the direction shown by arrow "A", via guide roller 24. The polymer film passes through several stations, is picked off from the surface of the rotating drum 16 by guide roller 26, and is taken up by take-up spool 22 as coated film 20'. As the polymer film 20 is taken off the source spool 13, it passes through a first plasma treatment unit 36, where the surface of the film to be coated is exposed to a plasma to remove adsorbed oxygen, moisture and any low molecular weight species from the surface of the film prior to forming the acrylate coating thereon. Just before the coated polymer film 20' is wound on the take-up spool 22, it passes through a second plasma treatment unit 38, where the coated surface of the film is exposed to a plasma to finish curing the acrylate coating and to remove any accumulated electronic charge.

The conditions of the plasma treatment are not critical, and the plasma source may be low frequency RF, high frequency RF, DC, or AC.

The rotating drum 16 is a water-cooled drum driven by a motor (not shown). The drum 16 is cooled to a temperature specific to the particular monomer being used and generally in the range of −20° to 50° C. to facilitate condensation of the monomer (in vapor form). The drum 16 is rotated at a surface speed within the range of 1 to 1000 cm/second.

The polymer film 20 may comprise any of the polymers that have the requisite properties to be treated as described below. Examples of such polymers include the thermoplastic polymers such as polypropylene (PP), polyethylene terephthalate (PET), polycarbonate, polyethylene-2,6-naphthalate, polyvinylidene difluoride, polyphenylene oxide, and polyphenylene sulfide, and the thermoset polymers such as polyimide, polyimide benzoxazole (PIBO), polybenzoaxozole (PBO), and cellulose derivatives.

The acrylate monomer is deposited on the polymer film 20 by the monomer evaporator 28, which is supplied with liquid monomer from a reservoir 40 through an ultrasonic atomizer 42, where, with the aid of heaters (not shown), the monomer liquid is instantly vaporized, i.e., flash vaporized, so as to minimize the opportunity for polymerization prior to being deposited on the polymer film 20. The specific aspects of this part of the process are described in greater detail in the above-mentioned U.S. Pat. Nos. 4,842,893; 4,954,371; and 5,032,461 and do not form a part of the present invention.

The flash-vaporized monomer condenses on the surface of the polymer film 20 that is supported on the cooled rotating drum 16, where it forms a thin monomer film.

The condensed liquid monomer is next radiation-cured by the radiation curing means 30. The radiation curing means may comprise any of the common methods for opening the double bonds of the acrylate monomer; examples of suitable means include apparatus which emit electron beam or ultraviolet radiation. Preferably, the radiation-curing means 30 comprises a thermionic or gas discharge electron beam gun. The electron beam gun directs a flow of electrons onto the monomer, thereby curing the material to a polymerized, cross-linked film. Curing is controlled by matching the electron beam voltage to the acrylate monomer thickness on the polymer film 20. For example, an electron voltage in the range of about 8 to 12 KeV will cure about 1 $\mu$m thick of deposited monomer. As with the specifics regarding the deposition of the acrylate monomer, the specific aspects of this part of the process are described in the above-mentioned U.S. Pat. Nos. 4,842,893; 4,954,371; and 5,032,461, and do not form a part of the present invention.

Figure 3A:
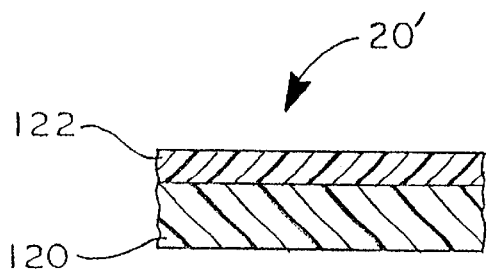
FIGS. 3A–E depict various combinations of films that may be deposited on a film substrate, including an acrylate film on the substrate (FIG. 3A), a metal film on an acrylate film on the substrate (FIG. 3B), an acrylate film on a metal film on an acrylate film on the substrate (FIG. 3C), an acrylate film on a metal film on the substrate (FIG. 3D), and both sides of the substrate coated with an acrylate film (FIG. 3E)

FIG. 3A depicts the coated film 20' at this stage, comprising an acrylate polymer film 122 on a polymer film web or substrate 120. Such a coated film 20' has a variety of uses, including high temperature electrical cables and foil capacitors in which the film is wound with a metal foil.

Figure 3B:
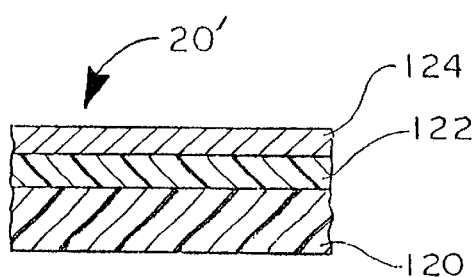

The cured acrylate monomer, or cross-linked polymer, then passes to the optional resistive evaporation system 32, where an inorganic material, such as aluminum or zinc, can, if desired, be deposited on the cured monomer layer. Two such coated films 20' may be wound to form metallized capacitors. FIG. 3B depicts a coated film 20' with a metallized layer 124 on the acrylate polymer film 122.

Figure 3C:
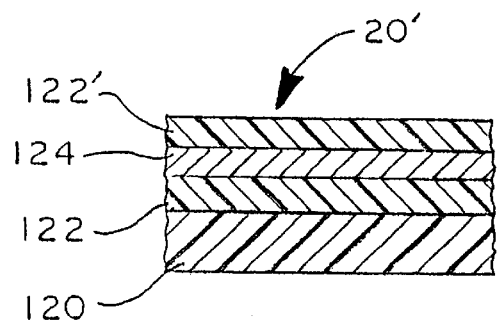
Figure 3D:
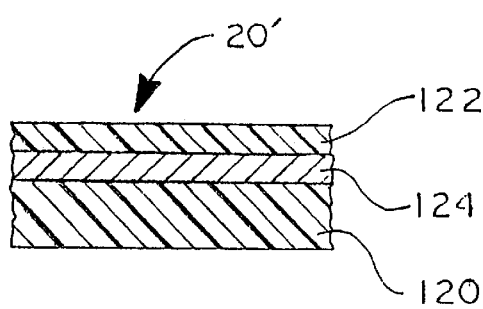

The same material may be used for food packaging films, preferably with an additional acrylate coating over the aluminum metal layer to protect the thin metal layer and thus improve the barrier properties of the film. FIGS. 3C and 3D depict two alternate configurations useful in food packaging. In FIG. 3C, the additional acrylate coating 122' is formed on top of the metal film 124, while in FIG. 3D, the metal film is first deposited on the polymer film substrate 120, followed by deposition of the acrylate film 122 thereon. The process for forming either of these configurations is discussed in greater detail below.

The resistive evaporation system 32 is commonly employed in the art for metallizing films. Alternatively, other metal deposition systems, such as a conventional electron beam vaporization device, and magnetron sputtering may be employed. The resistive evaporation system 32 is continually provided with a source of metal from the wire feed 44.

The deposition of the metal film may be avoided, thereby providing simply a hybrid polymer film, which may have a variety of uses, as described above, with reference to FIG. 3A.

Following the optional metallization stage, a second, optional acrylate monomer deposition may be performed, using monomer evaporator 128 and radiation-curing means 130. This second deposition is used to form the coated films 20' shown in FIGS. 3C and 3D, discussed above. The composition of the second acrylate film 122' may the same or different as that of the first acrylate film 122.

Figure 3E:
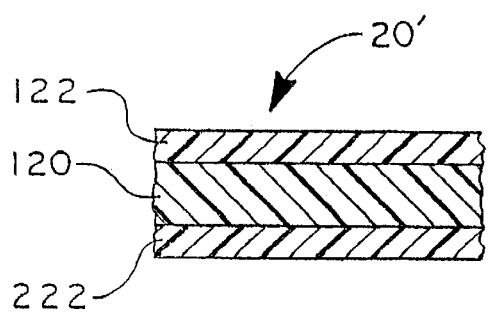

The apparatus shown in FIG. 1 is primarily directed toward the formation of an acrylate film 122, 122' on top of another polymer film 120, with or without a layer of metal 124. Further, the uncoated side of the polymer film 20 could also be coated with an acrylate film 222 of the same or different composition, for example, by providing a second rotating drum within the vacuum chamber 12 and providing the same sequence of devices (monomer evaporator 23 and radiation curing means 30, with optional metallization device 32). Such a coated film 20' is depicted in FIG. 3E.

The acrylate polymer film 122, 222 is formed to a thickness within the range of about 0.01 to 12 $\mu$m, depending on the particular application. While thicker films than this may be fabricated, no benefit seems to be derived using such thicker films.

The thickness of the polymer film substrate 20, 120 is typically within the range of about 1 to 100 $\mu$m, again, depending on the particular application.

When used with conventional polymer films employed in metallized capacitors, such as PP, PET, or polycarbonate, the thickness of the acrylate film 122, 222 is typically on the order of 0.1 to 1 $\mu$m. In such cases, the underlying base film (PP or polycarbonate) 20, 120 is much thicker; commercially available films of PP are in the range of 4 to 25 $\mu$m. Metallized thin film PP capacitors are used in low loss, AC applications, and the presence of the acrylate film provides a number of advantages, including greater reliability and, unexpectedly, improved corrosion resistance. The dielectric constant of the acrylate film for use in such applications preferably is in the range of about 2.5 to 4.0.

On the other hand, there are applications requiring energy storage in which higher dielectric constants in the range of about 10 to 15 are desired. In such cases, acrylate polymers having such a high dielectric constant are deposited on thinner films, and thus the acrylate film comprises a substantial fraction of the hybrid film thickness.

In packaging applications, the acrylate coatings 122, 222 are typically about 0.5 to 2.0 μm thick, deposited on PP or PET films 20, 120 that are typically 12 to 35 μm thick.

Examples of acrylate monomers that may be used in the practice of the present invention include ethoxylated bisphenol diacrylate, hexadiol diacrylate, phenoxyethyl acrylate, acrylonitrile, 2,2,2-trifluoromethyl acrylate, triethylene glycol diacrylate, iso-decyl acrylate, alkoxylated diacrylate, tripropylene glycol diacrylate, ethoxy ethyl acrylate, polyethylene glycol diacrylate, diethylene glycol diacrylate, trimethylol propane triacrylate, tetraethylene glycol diacrylate, cyano-ethyl (mono)-acrylate, octodecyl acrylate, dinitrile acrylate, pentafluorophenyl acrylate, nitrophenyl acrylate, iso-bornyl acrylate, tris(2-hydroxyethyl)-iso-cyanurate triacrylate, tetrahydrofurfuryl acrylate, neopentyl glycol diacrylate, propoxylated neo-pentyl glycol diacrylate, and mixtures thereof.

The metal film 124 that is deposited in the case of metallized capacitors may comprise aluminum or zinc or a composite film of nickel on aluminum, iron on aluminum, zinc on silver, zinc on copper, or zinc on aluminum. The thickness of the metal film 124 for capacitor use is on the order of 100 to 300 Å, and may be uniform across the width of the hybrid film 20' or may be thicker at the edges than in the central portion.

The metal film 124 that is used in packaging typically comprises aluminum. The thickness of the metal film is within the range of about 100 to 400 Å.

EXAMPLES

I. Capacitors

Capacitors employ low temperature thermoplastic dielectric thin film polymers, such as polypropylene (PP), polyethylene terephthalate (PET), polycarbonate, polyethylene-2,6-naphthalate, polyvinylidene difluoride (PVDF), polyphenylene oxide, and polyphenylene sulfide, either metallized or maintained between metal foil electrodes. Metallized film capacitors are used extensively in a broad range of electrical and electronic equipment that include motor run and motor start circuits for air conditioners, fluorescent and high intensity light ballasts, power supplies, telecommunication equipment, instrumentation, and medical electronics. In many of these applications, the metallized capacitors are used to conserve energy by correcting the power factor of a circuit and in others they are used to perform specific functions, such as timing, filtering, and decoupling. The advantages of metallized film over film foil capacitors include lower volume, weight, cost, and higher reliability due to the self-healing properties of the metallized films. The low temperature metallized film dielectrics find use in such a multitude of high voltage and high frequency capacitor applications due to their low dielectric loss.

One disadvantage, however, is lower current-carrying capacity due to the thin metallized electrodes that are deposited on low temperature thermoplastic dielectrics, such as PP, PET, and polycarbonate. In particular, reliability issues arise when metallized capacitors are forced to carry high levels of pulse or AC current. The present invention addresses the production of a hybrid film that has improved mechanical and thermal properties that improve capacitor performance and reliability.

The following discussion is directed to low loss, AC applications, involving the deposition of an acrylate film on a polypropylene film, followed by metallization to form a thin film metallized capacitor. It will be readily apparent to the person skilled in this art, however, that these teachings may be extended to other base polymer films for other applications.

Over 100 acrylate monomer materials have been polymerized and tested for dielectric constant and dissipation factor as a function of temperature and frequency, and oil and water surface wetting. Some of these materials were sourced from various vendors, others were formulated using proprietary mixtures of commercially available monomers, and some were molecularly synthesized. The acrylate polymer materials tested include the following: 2,2,2-trifluoroethylacrylate; 75% 2,2,2-trifluoroethylacrylate/25% $Cl_{19}$ diol diacrylate; 50% acrylonitrile/50% $C_{20}$ diol diacrylate; dimerol diacrylate; 50% acrylonitrile/50% $C_{19}$ diol diacrylate; Erpol 1010 diacrylate; 50% hexane diol diacrylate/50% $C_{20}$ triol diacrylate; 50% 2,2,2-trichloroacrylate/50% $C_{19}$ diol diacrylate; 75% 2,2,2-trifluoroethylacrylate/25% $C_{19}$ diol diacrylate; 50% octane diol diacrylate/50% 2-cyanoethyl acrylate; 67% 2,2,2-trifluoroethylacrylate/33% $C_{20}$ triol triacrylate; lauryl acrylate; trimethylolpropane triacrylate; ethoxyethoxy ethyl acrylate; pentaerythritol tetraacrylate; neo-pentyl glycol diacrylate; octyldecyl acrylate; tetraethylene glycol diacrylate; tripropylene glycol diacrylate; octane diol diacrylate; 1,8-alkoxylated aliphatic acrylate; decanediol diacrylate; ethylene glycol diacrylate; iso-bornyl acrylate; butanediol diacrylate; 93% hexane diol diacrylate/7% KENSTAT q100; 95% hexane diol diacrylate/5% chlorinated polyester diacrylate; trimethylolpropane ethoxylate triacrylate; trimethylolpropane propoxylate triacrylate; neo-pentyl glycol propoxylate diacrylate; bisphenol A ethoxylate diacrylate; alkoxylated aliphatic diacrylate ester; 50% 2-cyanoethyl acrylate/50% $C_{19}$ diol diacrylate; 92% trimethylolpropane triacrylate/8% acrylonitrile; 50% iso-bornyl acrylate/50% pentaerythritol triacrylate; 83% trimethylolpropane triacrylate/17% FLUORAD FX189; 50% acrylonitrile/50% trimethylolpropane triacrylate; 70% trimethylolpropane triacrylate/30% acrylonitrile; 40% FLUORORAD FX189/60% trimethylolpropane triacrylate; 70% hexane diol diacrylate/30% iso-bornyl acrylate; 50% hexane diol diacrylate/50% iso-bornyl acrylate; 12.5% aliphatic urethane triacrylate/87.5% hexane diol diacrylate; 31% KENSTAT q100/69% $C_{14}$ diol diacrylate; 69% $C_{14}$ diol diacrylate/31% acrylonitrile; 80% $C_{14}$ diol diacrylate/20% KENSTAT q100; 94% trimethylolpropane propoxylate triacrylate/6% KENSTAT q100; 50% trimethylolpropane triacrylate/50% acetonitrile; 70% trimethylolpropane triacrylate/30% acetonitrile; 88% phenol ethoxylate monoacrylate/12% acetonitrile; 80% $C_{14}$ diol diacrylate/20% acetonitrile; 80% $C_{14}$ diol diacrylate/20% KENSTAT q100; 12% trimethylolpropane triacrylate/88% iso-bornyl acrylate; 69% $C_{14}$ diol diacrylate/23% KENSTAT q100/8% trimethylolpropane triacrylate; 33% acetonitrile/33% polyamine acrylate/34% iso-bornyl acrylate; 75% aliphatic amine acrylate/17% KENSTAT q100/8% trimethylolpropane triacrylate; 80% $C_{14}$ diol diacrylate/20% FLUORAD FX189; 80% phenol ethoxylate monoacrylate/20% pentaerythritol triacrylate; 80% hexane diol diacrylate/20% acrylonitrle; 70% hexane diol diacrylate/15% acrylonitrile/

15% trimethylolpropane triacrylate; propoxylated glycerine triacrylate; ethoxylated trimethylolpropane triacrylate; caprolactone acrylate; 90% alkoxylated trifunctional acrylate/10% beta-carboxyethyl acrylate; 90% polyethylene glycol 200 diacrylate/10% pentaerithritol di tri tetraacrylate; 75% hexane diol diacrylate/25% KenReact LICA 44; 50% pentaerythrytol tetraacrylate/50% hexane diol diacrylate; pentaerythritol polyoxyethylene petraacylate; tetrahydrofurfuryl acrylate; 25% KENSTAT q100/75% hexane diol diacrylate; 50% tetrahydrofurfuryl acrylate/50% polyethylene glycol 200 diacrylate; 88% tetrahydrofurfuryl acrylate/12% trimethylolpropane triacrylate; 88% caprolactone acrylate/12% trimethylolpropane triacrylate; EBECRYL 170; 80% EBECRYL 584/20% beta-carboxyethyl acrylate; 88% tetrahydrofurfuryl acrylate/12% beta-carboxyethyl acrylate; 88% EBECRYL 170/12% beta-carboxyethyl acrylate; aliphatic polyesther hexaacrylate oligomer; aliphatic urethane diacrylate; tripropylene glycol diacrylate; hexane diol diacrylate; 88% iso-bornyl acrylate/12% beta-carboxyethyl acrylate; 90% polyethylene glycol 200 diacrylate/5% iso-bornyl acrylate/5% pentaerythritol triacrylate; 82% polyethylene glycol 200 diacrylate/12% hexane diol diacrylate/6% trimethylolpropane triacrylate; 75% tetrahydrofurfuryl acrylate/15% hexane diol diacrylate/5% trimethylolpropane triacrylate/5% oligomer; 44% polyethylene glycol 200 diacrylate/44% acrylonitrile/12% hexane diol diacrylate; 70% $C_{14}$ diol diacrylate/30% aliphatic urethane acrylate oligomer; trimethylolpropane ethoxylate triacrylate; and 50% PHOTOMER 6173/50% hexane diol diacrylate 50%. Notes: KENSTAT q100 and KenReact LICA 44 are trade names of Kenrich Corp.; FLUORAD FX189 is a trade name of 3M Industrial Chemical Corp.; EBECRYL 170 and EBECRYL 184 are trade names of UCB Radcure Corp.; and PHOTOMER 6173 is a tradename of Henkel Corp.

Several acrylate polymers were identified as candidate materials for AC voltage capacitor designs. These are low dissipation factor (DF) polymers with DF<0.01, i.e., <1%, and dielectric constant (κ) in the range 2.5<κ<4.0.

PP-acrylate hybrid films were produced using a production-size vacuum metallizing chamber that was retrofitted to allow deposition of the acrylate coatings in line with the metallization process. PP films of 6 μm, 8 μm, 12 μm, and 19 μm were first is treated with a gas plasma and then coated with acrylate polymer films with thicknesses of about 0.2 to 1.0 μm. Dielectric characterization of small area stamp capacitors, with PP (control) and hybrid films, showed that the PP-acrylate films had superior current carrying capability, higher resistance to degradation from partial discharges (corona), and breakdown voltage equal to or higher than PP films of equal thickness.

An additional benefit that was unexpected was improved corrosion resistance of the metallized aluminum electrodes when deposited on the acrylate coating rather than on the PP film. This is very significant because it allows the use of thinner aluminum layers, which increases the self-healing properties of the hybrid film capacitors.

Several full-size capacitor designs were produced and tested. Capacitors with ratings of 8 μF/330 VAC, 0.1 μF/1200 VDC, and 0.1 μF/2000 VDC were built using acrylate-coated 6 μm, 12 μm, and 19 μm PP films, respectively. Short-term current, humidity, and breakdown voltage tests showed that the acrylate-PP hybrid capacitors followed the performance of the small area stamp capacitors. That is, the hybrid film capacitors had significantly higher performance than that of the PP control capacitors. In a critical high dV/dt test that applied 5000 V pulses with a rise time of 1000 V/50 ns, the 0.1 μF/2000 V capacitors outperformed by far commercial capacitors that used double metallized PET film electrodes (for higher current carrying capacity) and equal thickness dielectric. The commercial capacitors degraded or failed after 2400 pulses, while there was no degradation in the 19 μm hybrid film capacitors. In fact, the 12 μm hybrid film capacitors (0.1 μF/1200 V) that were less than half the volume of the 19 μm capacitors were also superior to the commercial capacitors when tested under the same conditions. A comparison of 12 μm PP lighting ballast capacitors with 12 μm acrylate-PP film capacitors using 3000 V pulses showed no degradation in the hybrid film capacitors, while the performance of conventional capacitors from two different manufacturers varied from significant degradation to complete failure.

Large quantities of acrylate hybrid films were coated, metallized, and wound into capacitors using conventional winding equipment. The acrylate-PP film handled as well as any capacitor film through the various process steps. Since the acrylate polymer can be deposited in-line with the metallization, and in the same vacuum chamber, added labor cost is minimal. The base acrylate monomers are available at a cost of $3/lb to $4/lb and at a thickness of about 1 μm, added material cost will be minimal.

A. Hybrid Film Production Process Development

Acrylate-PP hybrid films were produced using 6 μm, 8 μm, 12 μm, and 19 μm PP films that were readily available. Rolls of film 32 cm wide were used that were at least a few thousand feet long (typical size for small metallizing runs). The apparatus employed in the coating process is shown schematically in FIG. 1. The liquid monomer was pumped from the reservoir 40 that was located outside the vacuum chamber 12 into the flash evaporator 28. The liquid monomer was atomized into microdroplets with the use of the ultrasonic atomizer 42 that was positioned on top of the evaporator 28. The evaporator 28 was held at a temperature which was above the boiling point of the liquid, but below its decomposition point. This caused the monomer to flash evaporate before it cured. The molecular vapor exited at supersonic speeds and condensed on the film 20 that was in intimate contact with the chilled rotating drum 16. The condensed thin film deposit then moved in front of the electron beam gun 30 where it was polymerized.

Examples of suitable acrylates useful in the practice of the invention include iso-bornyl acrylate, hexane diol diacrylate, and tripropylene glycol diacrylate that were formulated for fast cure, proper viscosity, and good adhesion to the PP film. These acrylates all have a dissipation factor of less than 0.01.

Several large rolls of 6 μm and 8 μm PP film were coated under various conditions until a set of parameters that produced a well-cured, uniform coating was obtained. The major process parameters are as follows:

1. Drum Temperature: Good films may be made within the temperature range from room temperature to −20° C. The lower temperature appeared to increase somewhat the condensation rate with some monomers, but not with others. It is estimated that the residence time of the film on the drum was not sufficient to transfer much of the drum temperature to the top surface of the film. As a result, the difference in drum temperature did not have a major affect on the monomer condensation rate.

2. Drum Speed: Good films were produced with drum surface speeds anywhere in the range of 50 to 1000 feet/min (25 to 500 cm/sec).

3. Radiation Dose: The accelerating potential was 12 KeV and the current delivered to the monomer was about 2 mA for curing monomer films 1 μm thick.

4. Final Monomer Mixture: Most of the monomer mixtures that were processed produced good quality coatings when considering parameters such as uniformity, degree of cure, and adhesion to the PP film. One example of a suitable monomer mixture comprised a mixture of 70% hexanediol diacrylate, 20% iso-bornyl acrylate, and 10% tripropylene glycol diacrylate.

5. Plasma Treatment Prior to Acrylate Deposition: The PP film was plasma-treated prior to the deposition of the monomer vapor for the following reasons:

a. The PP film surface has absorbed oxygen and moisture that interferes with the polymerization of the acrylate monomer. Oxygen is a free radical scavenger that neutralizes free radicals created by the electron beam, thus inhibiting the polymerization process.

b. The plasma treatment etches and cleans the film surface from low molecular weight residue created by the corona treatment process. This improves the wetting of the monomer to the film, resulting in a more uniform coating.

6. Plasma Treatment After Deposition of the Acrylate Polymer: This is a post-treatment that was used to reduce the static charge on the coated film and also complete the polymerization process on the acrylate surface. This process step reduced the "stickiness" on the acrylate-PP wound roll.

B. Evaluation of the Hybrid Films Using Small Area Films

The hybrid films were first evaluated using small area stamp capacitors, and then full-size-wound capacitors were fabricated for further evaluation. Stamp capacitors were used to evaluate breakdown strength, current carrying capacity, partial discharge (corona) degradation of the polymer films, and corrosion resistance of the metallized electrodes.

1. Dielectric Constant and Dissipation Factor

The acrylate coating, due to its low thickness, had minor influence on both the and DF of the hybrid films. Depending on the particular hybrid, the dielectric constant of the acrylate-PP films was up to 7% higher than that of plain PP film.

2. DC Breakdown Strength

This measurement was made to ensure that the hybrid film had a breakdown strength at least as high as that of the original PP film, plus an additional amount due to the acrylate coating. The breakdown measurements on the films were done using a dry double-metallized and non-contact measurement technique that was performed at high vacuum ($<10^{-4}$ Torr), to eliminate partial discharges and surface flashovers. The breakdown system was built in a turbomolecularly pumped stainless-steel chamber. Metallization masks were designed and fabricated that allowed metallization of small area (about 1 square inch) stamp capacitors for the breakdown measurements. The electrode contact was made to metallized pads that were outside the active area to prevent film damage. The voltage was ramped at about 500 V/sec. For every breakdown measurement that is reported below, at least 18 stamp capacitors were tested to ensure that the data is statistically significant.

The results of the DC breakdown tests of 6 μm and 8 μm films coated with about 0.5 μm of acrylate polymer are shown in Table I. The acrylate polymer is produced by electron beam curing of a 70% hexanediol diacrylate, 20% iso-bornyl acrylate, and 10% tripropylene glycol diacrylate monomer film deposited in the vacuum using the experimental apparatus described in FIG. 1. The PP film was first plasma-treated using an argon gas plasma and the acrylate monomer was flash evaporated on the treated surface.

TABLE I

| FILM | THICKNESS (μm) | BREAKDOWN VOLTAGE (KV) |
|---|---|---|
| Control PP | 6 | 3.87 |
| PP/plasma/acrylate | 6.5 | 4.25 |
| Control PP | 8.0 | 4.84 |
| PP/plasma/acrylate | 8.5 | 5.34 |
| Control PP | 12.0 | 5.30 |
| PP/plasma/acrylate | 12.5 | 6.26 |

The breakdown voltage of the control and acrylate hybrid films was measured by metallizing one square inch electrodes on opposing sides of the films. Each measurement represents an average of at least eighteen individual breakdown measurements. The data in Table I show that the acrylate-coated PP films have a breakdown strength that is higher than the control PP film by about 10%. Given that the coating thickness is about 0.5 μm, the breakdown strength of the acrylate-PP films is equal to or higher than PP films. Similar measurements on single acrylate layers have shown that the breakdown strength of 1 μm thick films is 20 to 24 KV/mil, which is equal to or higher than that of PP film.

3. Current-Carrying Capacity

It is well-known that due to the low melting point of PP film, metallized PP capacitors become quite unreliable at high current applications due to thermal damage of the termination. The current generates $I^2R$ losses (R=Equivalent Series Resistance, ESR) at the termination, which raises the temperature, which in turn damages the termination and increases the ESR. This process eventually causes a catastrophic failure. Life test data showed that many conventional PP capacitor designs have marginal current carrying performance. For this reason, in some high current designs, double metallized paper or double metallized PET film that has a higher melting point than PP is used to carry the current. These PET/PP designs are inefficient and result in expensive capacitor products.

To simulate the current flow from the sprayed termination to the metallized film, and the ability of the film to carry high currents without thermal damage, a simple test was developed to measure the maximum power that a metallized film can dissipate prior to a thermal failure. Current was forced through a section of metallized film and the power (IxV) was increased until the dissipated heat forced the film to fail. The fixture had ½ inch wide contact electrodes which were placed 5 inches apart. AC voltage was applied to the electrodes and the current through the circuit was recorded. The voltage was raised until the power loss thermally degraded the metallized film to the point of failure. In the films that were tested, the failure was an open circuit caused by melting of the PP film at some point close to the middle of the 5 inch strip. Table II shows the average power to failure (eight samples were tested for each condition), for both coated and uncoated 8 μm thick polypropylene. The acrylate polymer was produced by electron beam curing of a 70% hexanediol diacrylate, 20% iso-bornyl acrylate, and 10% tripropylene glycol diacrylate monomer film deposited in the vacuum using the experimental apparatus described in FIG. 1. The PP film was first plasma-treated using an argon gas plasma and the acrylate monomer was flash-evaporated on the treated surface.

TABLE II

| FILM TYPE | POWER (Watts) | IMPROVEMENT OVER CONTROL PP (%) |
|---|---|---|
| Control PP | 13.5 | — |
| PP/plasma/0.2 μm acrylate | 14.0 | 3.7 |
| PP/plasma/0.4 μm acrylate | 14.8 | 9.6 |
| PP/plasma/0.6 μm acrylate | 15.6 | 15.6 |
| PP/plasma/0.8 μm acrylate | 19.4 | 43.7 |
| PP/plasma/1.0 μm acrylate | 22.0 | 63.0 |

The results show that the coated films have a higher thermal capacity that varies from 4% to 63%. The variation is due mostly to the thickness of the acrylate coating.

It is interesting to note that although the coated films failed at significantly higher power levels, they did not deform and shrink as much as the plain films. The higher thermal capacity of the hybrid films was a key objective of this work and it is clear that thin coatings of the high temperature acrylate films can have a significant impact in the thermal properties of PP.

4. Resistance to Degradation from Partial Discharges (Corona)

One of the common mechanisms of failure in high voltage (V>300 VDC) film capacitors is damage to the polymer dielectric from partial discharge activity (corona) in the capacitor windings. The partial discharges or corona pulses are generated in inter-electrode areas that have large enough air gaps to sustain a certain level of ionization. The high temperature corona pulses, although they physically move around, can degrade the polymer dielectric and cause a breakdown. Dry metallized capacitors are particularly susceptible to corona damage, especially at the outer and innermost turns which are looser than the rest of the roll. Metallized capacitors that have electrodes with reasonably high resistance (3 to 8 ohm/sq) have good self-healing properties, and the corona-induced clearings will result in some capacitance loss with no further damage to the capacitor. Capacitors with electrodes of 2 to 3 ohm/sq have poorer clearing properties. The resulting high levels of corona can lead to major capacitance loss, increased dissipation factor, higher leakage current, and often catastrophic failures.

Resistance to the damaging thermal effects of the corona pulses increases as the thermal stability of the polymer film increases. Control polyvinylidene difluoride (PVDF) and polypropylene (PP) films were tested along with PVDF/plasma/acrylate and PP/plasma/acrylate hybrid films for resistance to corona degradation. The acrylate polymer was produced by electron beam curing of a 70% hexanediol diacrylate, 20% iso-bornyl acrylate, and 10% tripropylene glycol diacrylate monomer film deposited in is the vacuum using the experimental apparatus described in FIG. 1. The PP film was first plasma-treated using an argon gas plasma and the acrylate monomer was flash-evaporated on the treated surface.

The acrylate-PVDF hybrid was included because PVDF film is the highest energy density capacitor dielectric that is commercially available, and an acrylate-PVDF hybrid may present some unique product opportunities. Furthermore, the PVDF film has about the same melting point as PP. The PVDF stamp capacitors were liquid impregnated and tested at 1200 VAC. The PP capacitors were dry and tested at 350 VAC. This test was an accelerated corona test, where the level of partial discharges reflected either poor impregnation (impregnated cap), or loose outer turns in a dry capacitor. To date, several stamp capacitors have been tested, and the results are shown in Table III.

TABLE III

| CAPACITOR NUMBER | FILM TYPE | TIME TO BREAKDOWN (min.) |
|---|---|---|
| 1 | Control PVDF, 12 μm | 3.0 |
| 2 | Control PVDF, 12 μm | 3.8 |
| 3 | Control PVDF, 12 μm | 5.1 |
| 4 | Control PVDF, 12 μm | 3.8 |
| 5 | PVDF/plasma/1 μm acrylate) | 47.8 |
| 6 | PVDF/plasma/1 μm acrylate) | 29.0 |
| 7 | PVDF/plasma/1 μm acrylate) | 32.0 |
| 8 | PVDF/plasma/1 μm acrylate) | 33.8 |
| 9 | Control PP, 8 μm | 19.0 |
| 10 | PP/plasma/1 μm acrylate | 133.0 |

As seen in Table III, the hybrid films had about one order of magnitude longer time to failure. This can raise the reliability level of the capacitors significantly. In the case of a pulse-type capacitor, it may represent a large number of additional pulses prior to failure from corona degradation.

5. Corrosion Resistance

Capacitance loss due to electrode corrosion is the most common failure mechanism in metallized capacitors. The corrosion resistance of aluminum electrodes deposited on control PP and PP/plasma/acrylate films was tested. The corrosion stability of aluminum metallized PP and PP/plasma/acrylate films was tested by measuring the change in electrical resistance of a 5 inch by 1 inch metallized strip, after exposure in a temperature/humidity environment of 70° C./85% RH. The 5 inch strips were cut out of large bobbins of material which were also used to make fill size capacitors. In order to assure that a good electrode contact was made at each measurement (especially as the electrode starts to corrode), a thicker aluminum pad was deposited at both ends of the 5 inch strip.

Figure 2:
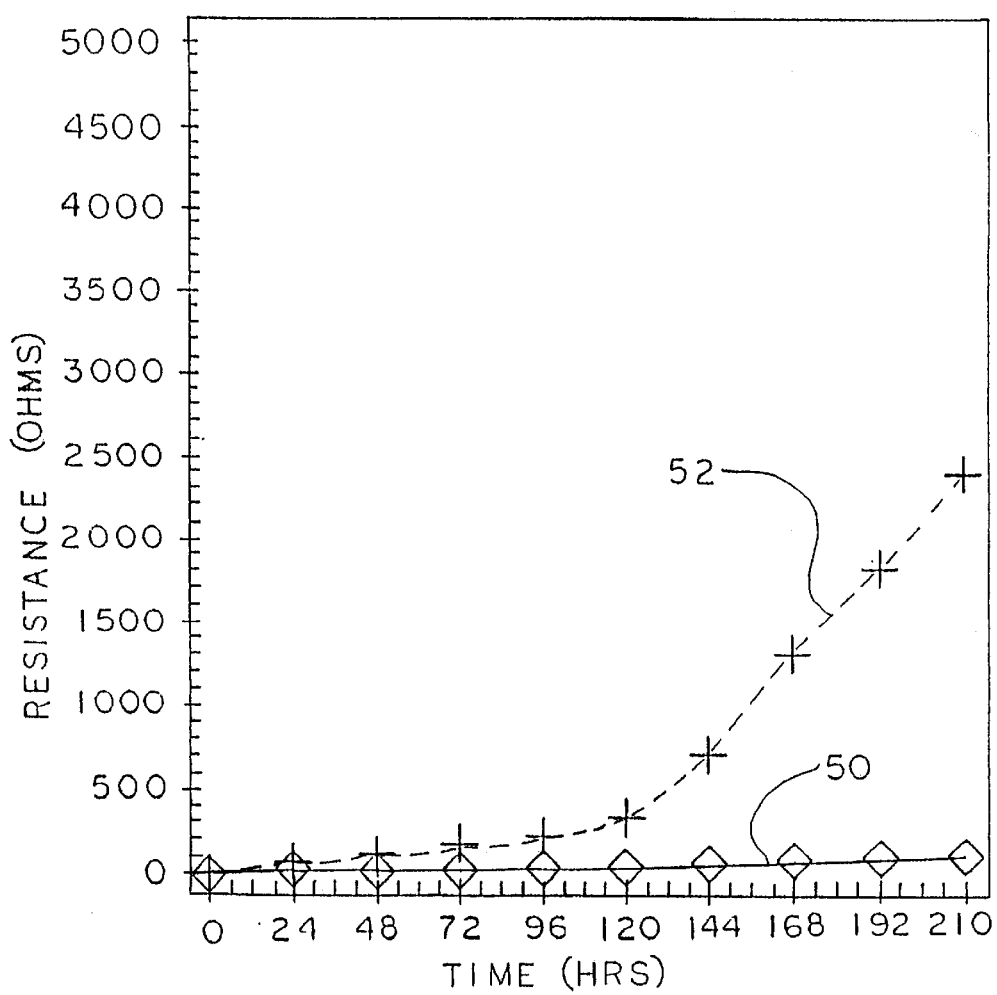
FIG. 2, on coordinates of electrical resistance (in ohms) and time (in hours), is a plot showing changes in electrical resistance due to the corrosion of aluminum deposited on control polypropylene (PP) film and on PP/plasma/acrylate hybrid film, in which the aluminum metallized films were exposed to temperature and humidity ambient conditions of 70° C. and 85% relative humidity, respectively.

The control PP and hybrid films were produced from the same roll of PP film by plasma treating and acrylate coating half the roll (32 cm wide and about 10,000 feet long) and then metallizing the entire roll in a single metallizing run. FIG. 2 shows the change in electrical resistance as a function of time for 6 μm control PP film (Curve 52) metallized with aluminum side by side with PP/plasma/1 μm acrylate film (Curve 50). The acrylate polymer was produced by electron beam curing of a 70% hexanediol diacrylate, 20% iso-bornyl acrylate, and 10% tripropylene glycol diacrylate monomer film deposited in the vacuum using the experimental apparatus described in FIG. 1. The PP film was first plasma-treated using an argon gas plasma and the acrylate monomer was flash-evaporated on the treated surface. The data shows that the metallized aluminum electrodes on the hybrid films have superior corrosion resistance.

The surface properties of the polymer film play a major role in the structural and chemical stability of the metallized electrodes. Several studies have been conducted in the past that show that surface treatment of the polymer films prior to the metallization improves the adhesion and corrosion resistance of the aluminum electrodes. Film cross-linking, polar chemical functionalities and lack of low molecular weight material are parameters that favor the acrylate surface. In addition, PP film, as a rule, is always corona or flame treated prior to metallization. This is done in-line with the film manufacturing process. Subsequent exposure to ambient conditions leads to moisture adsorption by the carboxyl, carbonyl, and hydroxy groups formed by the treatment process. The adsorbed moisture will react with the aluminum deposit and degrade its chemical stability.

The above tests indicate that the acrylate hybrid films have unique surface properties surface that enhance the chemical resistance of evaporated aluminum metal coatings.

C. Evaluation of Hybrid Films Using Full Size Capacitors

Full size capacitors based on an 330 VAC design were fabricated using control 8 $\mu$m PP films and PP/plasma/0.7 $\mu$m acrylate hybrid film. The acrylate polymer was produced by electron beam curing of a 70% hexanediol diacrylate, 20% iso-bornyl acrylate, and 10% tripropylene glycol diacrylate monomer film deposited in the vacuum using the experimental apparatus described in FIG. 1. The PP film was first plasma-treated using an argon gas plasma and the acrylate monomer was flash-evaporated on the treated surface. The capacitors were wound in solid hex-cores and they had a cylindrical shape.

Full size capacitors were built and life-tested for electrode corrosion resistance under the same conditions as the small area films. Instead of measuring the capacitance change, due to the short test period, the optical density of the electrodes was measured. In this manner, the aluminum oxidation could be detected even when the electrode was conducting, which would not result in a capacitance loss. The optical density was initially measured on the bobbins that were used to make the capacitors. After the test, the capacitors were unwound and the optical density of the metallized film was measured at the outer part of the roll, at some fixed distance away from the end of the winding. The results of this test are shown in Table IV. Four sets of capacitors were made using control PP and PP/plasma/0.7 $\mu$m acrylate hybrid film metallized with thin aluminum (optical density 1.25 and 1.51, denoted as (1) in Table IV) and thicker aluminum (optical density 1.68 and 1.76, denoted as (2) in Table IV).

TABLE IV

CHANGES IN OPTICAL DENSITY OF ALUMINUM METALLIZED CAPACITOR FILMS OF PP AND PP/PLASMA/0.7 $\mu$m ACRYLATE FILMS, DUE TO CORROSION IN A 70° C. AND 85% RH ENVIRONMENT.

| MATERIAL | OPTICAL DENSITY, 0 HOURS | OPTICAL DENSITY, 214 HOURS | PERCENTAGE CHANGE OVER 214 HOURS |
|---|---|---|---|
| Hybrid (1) | 1.25 | 0.98 | −21.60 |
| Control PP (1) | 1.51 | 0.55 | −63.58 |
| Hybrid (2) | 1.68 | 1.38 | −17.86 |
| Control PP (2) | 1.76 | 1.41 | −19.89 |

The results in Table IV indicate that the corrosion performance of control PP and acrylate-PP hybrid films, when wound into capacitors rolls, is basically the same as that of the small area films (Hybrid (1) is the same film material tested in small area samples, see FIG. 2). That is, metallized capacitors wound with acrylate hybrid films suffer less electrode corrosion than similar parts produced with metallized control PP films.

This is a significant advantage for the hybrid films. The improved corrosion resistance of the metallized electrodes will allow use of this product in applications where the capacitors are exposed to higher humidity and temperature.

A high frequency, high current/low voltage test was developed to evaluate the current carrying capacity of the capacitor termination. The current through the capacitors was altered by varying the voltage amplitude of the high frequency signal. After testing several capacitors to determine a set of conditions that would degrade the capacitor termination by some measurable amount, both plain PP and hybrid film capacitors were tested. The test data as shown in Table V demonstrates that capacitors built with the acrylate-PP hybrid film dielectrics have superior parametric stability than sister units produced with control PP film.

TABLE V

DISSIPATION FACTOR AND ESR OF CAPACITORS BUILT WITH PP AND ACRYLATE-PP HYBRID FILM. THEY ARE TESTED AT 40 KHz BEFORE AND AFTER THE HIGH CURRENT TEST.

| UNIT # | CAP ($\mu$f) | DF (%) | ESR (m ohms) |
|---|---|---|---|
| INITIAL VALUES | | | |
| Control PP | 8.92 | 1.13 | 5.0 |
| Hybrid (2) | 8.86 | 0.65 | 2.9 |
| AFTER 10 MIN. 25 KHz 50 A PEAK AT 60 V PEAK | | | |
| Control PP | 8.76 | 1.15 | 5.20 |
| Hybrid (2) | 8.82 | 069 | 3.10 |
| AFTER 5 ADD'L MIN. 25 KHz 75 A PEAK AT 85 V PEAK | | | |
| Control PP | 7.40 | 11.00 | 59.20 |
| Hybrid (2) | 8.59 | 0.71 | 3.30 |

The current-carrying performance of the fill size capacitors is in line with the current or power dissipation performance of the small area metallized films (Table IV). Furthermore, it is interesting to note that the fill size hybrid film capacitors were fabricated with Hybrid (2) film (see Table IV), which did not have the highest power dissipation performance. This suggests that capacitors built with optimized hybrid films could have far superior performance to the capacitors that were tested.

Capacitors with 0.1 $\mu$F capacitance were fabricated, using 19 $\mu$m PP/plasma/1.0 $\mu$m acrylate (referred to as Hybrid A in Table VI) and 12 $\mu$m PP/plasma/1.0 $\mu$m acrylate (referred to as Hybrid B in Table VI). These capacitors were arbitrarily rated 0.1 $\mu$F/2000 VDC and 0.1 $\mu$F/1200 VDC, respectively. The acrylate polymer was produced by electron beam curing of a 70% hexanediol diacrylate, 20% iso-bornyl acrylate, and 10% tripropylene glycol diacrylate monomer film deposited in the vacuum using the experimental apparatus described in FIG. 1. The PP film was first plasma-treated using an argon gas plasma and the acrylate monomer was flash-evaporated on the treated surface.

The capacitors were compared with state-of-the-art high current commercial capacitors, which although they had a rating of 0.1 $\mu$F/1200 V, they also utilized 19 $\mu$m PP dielectric and double metallized polyester (PET) film electrodes, to carry the high current. These capacitors were about the same size as the Hybrid (A) film 0.1 $\mu$F metallized capacitors and more than double the volume of the Hybrid (B) 0.1 $\mu$F capacitors.

All capacitors were tested using 5,000 V pulses with a dV/dt of 1000 V/ns. The capacitance and ESR were measured using a conventional electronic capacitance bridge. The initial capacitance and ESR are compared to the after test capacitance and ESR in Table VI below.

TABLE VI

VOLTAGE AND CURRENT CARRYING COMPARISON OF STATE OF THE ART COMMERCIAL PP CAPACITORS AND CAPACITORS BUILT WITH ACRYLATE HYBRID FILMS OF THE PRESENT INVENTION

| Initial Capacitance @ 100 KHz (nf) | Initial ESR @ 100 KHz (milliohms) | Final Capacitance @ 100 KHz (nf) | Final ESR @ 100 KHz (milliohms) |
|---|---|---|---|
| Commercial Capacitor | | | |
| 98.53 | 5 | 63.72 | 2115 |
| 98.34 | 6 | 33.91 | 8294 |
| 98.36 | 5 | 98.11 | 5 |
| 101.72 | 7 | 33.97 | 7768 |
| 97.69 | 5 | 62.94 | 2050 |
| 97.30 | 6 | 51.81 | 3249 |
| 98.35 | 7 | 51.30 | 3112 |
| 98.11 | 3 | 98.00 | 6 |
| Average Change: | | −37.4% | +3319.5 mΩ |
| Present Invention, 19 μm Hybrid (0.1 μF/2000 V) | | | |
| 102.13 | 8 | 101.90 | 9 |
| 103.43 | 9 | 103.37 | 9 |
| 102.83 | 6 | 102.83 | 9 |
| 103.30 | 4 | 103.28 | 4 |
| 103.77 | 4 | 103.76 | 4 |
| 95.08 | 4 | 95.08 | 4 |
| 103.61 | 9 | 103.59 | 9 |
| 103.43 | 8 | 103.43 | 9 |
| Average Change: | | −0.05% | +0.62 mΩ |
| Present Invention, 12 μm Hybrid (0.1 μF/1200 V) | | | |
| 100.06 | 5 | 99.79 | 10 |
| 99.82 | 11 | 81.89 | 395 |
| 101.30 | 9 | 82.70 | 302 |
| 101.70 | 11 | 94.80 | 229 |
| 100.30 | 10 | 86.10 | 901 |
| 102.60 | 14 | 80.00 | 411 |
| 100.80 | 10 | 87.10 | 439 |
| 101.90 | 10 | 99.90 | 45 |
| Average Change: | | −11.9% | +331.5 mΩ |

It can be seen that the 0.1 μF/2000 VDC (Hybrid (A)) design, outperforms the equal size commercial design by a very large margin. In fact, the data shows that all but two of the commercial capacitors failed, while none of the capacitors prepared by the process of the present invention had any significant degradation. With regard to the 0.1 μF/1200 V (Hybrid (B)) capacitors prepared in accordance with the present invention (that have less than half the size of the commercial capacitors), the data show that although these capacitors degraded, on average, they performed better than the state of the art commercial capacitors.

II. Food Packaging Films

In packaging applications, barrier films are of particular interest for separating products such as food and electronic components from environments that reduce product life. Such barrier films may be achieved either using films in which the barrier is built into the film or by applying a coating to a film. The barrier coating may be either transparent, comprising oxide materials for example, or opaque or semi-transparent, comprising metals for example.

Extension of shelf life at a competitive cost has been a continuing challenge for film producers, metallizing houses and laminators. Specifically, for food applications, the metallized film acts as (a) an oxygen and moisture barrier, to help keep food fresh and crisp, (b) a light barrier, to reduce rancidity in fatty foods, and (c) an aroma barrier, to keep the original flavor intact. Additional requirements include processability of the metallized film, abrasion resistance, mechanical robustness, reliability and cost.

A. Opaque Metallized Barrier Films

The barrier properties of the metallized aluminum films depend almost entirely on the integrity of the metallized aluminum layer. The quality of the metallized layer depends on defects on the surface of the polymer film. Gross defects are manifested mainly in the form of pinholes in the metallization that are visible with the optical microscope. Pinhole defects are usually traced to particles on the film surface and abrasion of the aluminum on film fibrils and other surface protrusions caused by antioxidants and slip agents. These features dot the surface landscape of the films and are characteristic of a particular film vendor and manufacturing process. Although the number and size of pinholes can dominate the transmission of oxygen through the film, there are additional microstructure defects that determine the ultimate barrier possible for a given film. Microstructure defects can have several forms that include micropinholes, microcracks, and microareas of very thin aluminum. These defects can be traced to properties of the substrate film that involve the basic film chemistry and manufacturing process. Parameters such as the molecular weight of the resin used to make the film additives to the resin, process conditions and surface treatment of the film. Improved barrier performance can be achieved by minimizing both gross and microstructure defect density on the film surface.

Several materials were investigated for use in the production of high barrier metallized films. One prerequisite is that the monomer and of course the polymer coatings must have a low amount of volatile components, to assure that the package material does not produce an odor. In order to qualify polymer materials, a standard "aroma test" was conducted, and many of the polymer materials that were tested passed the test. A deodorized version of tripropylene glycol diacrylate was arbitrarily chosen to conduct oxygen barrier tests.

For opaque high oxygen barrier packages (potato chip bags), the industry standard is polypropylene film (PP) metallized with a thin layer of aluminum (Al). The barrier material development included the following designs of metallized PP and acrylate hybrid films.

1. PP/Plasma/Al/Acryl/Plasma

The acrylate polymer was produced by electron beam curing of a tripropylene glycol diacrylate monomer film deposited in the vacuum using the experimental apparatus described in FIG. 1. The thickness of the acrylate polymer was about 1.0 μm thick. The PP film was first plasma-treated using a gas plasma produced by an Ar/$N_2$ gas mixture with a 10%/90% ratio, and aluminum was applied on top of the plasma-treated surface. The acrylate polymer was applied on top of the thin aluminum metal to prevent pinhole formation from abrasion of the film surface on rollers in the vacuum chamber and in subsequent processes such as slitting and laminating. The structure is depicted in FIG. 3D.

Figure 4:
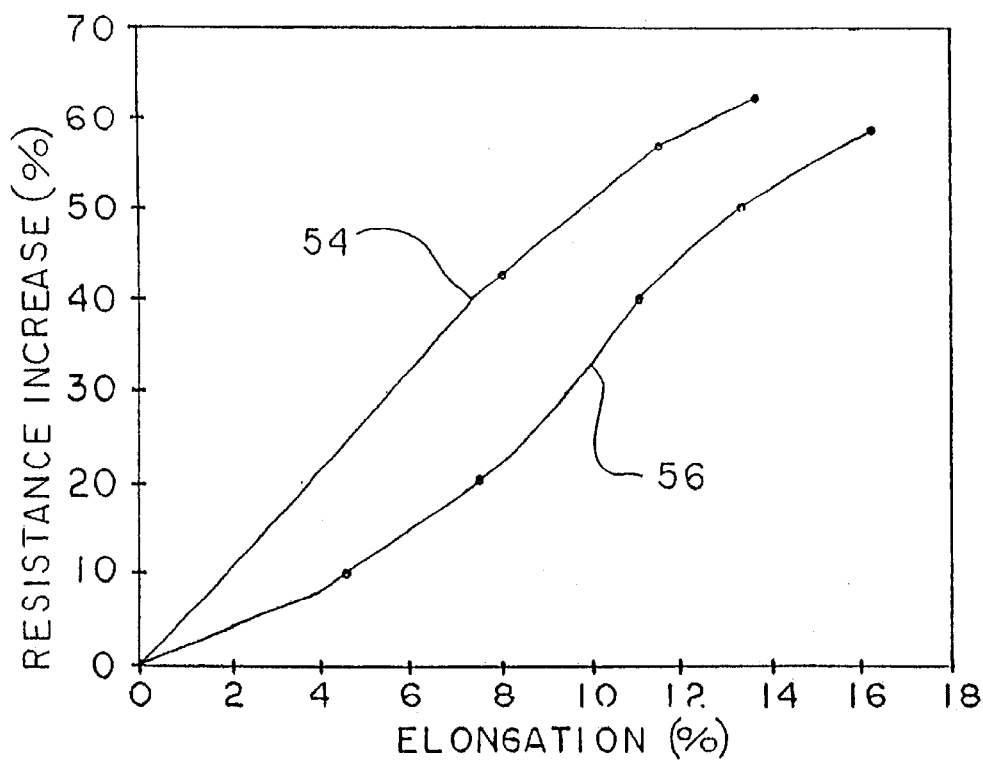
FIG. 4, on coordinates of increase in electrical resistance (in percent) and elongation (in percent), plots the electrical resistance increase as a function of elongation, which is an indication of resistance to corrosion, for an untreated metallized polymer film and for a metallized polymer film that is plasma-treated.

The plasma treatment functionalization of PP film resulted in higher nucleation rates of the aluminum and finer crystal structure. The formation of finer aluminum crystallites was confirmed using X-ray diffraction (XRD) analysis. Specifically, the metallized films were tested using a Scintag XRD system, which revealed that the aluminum 2.344 CPS peak for the plasma-treated film was at least three times less intense and about twice as broad as the non-treated metallized film. Also, transmission electron microscopy (TEM) and electron diffraction analysis conducted on a Hitachi TEM showed that the crystals in the aluminum deposited on the plasma-treated PP film were much smaller with very broad diffraction rings (when compared to the aluminum deposited on control PP). The finer aluminum crystallites result in a more flexible metal film that resists microcracking during stretching. This was measured by monitoring the electrical resistance of a metallized film while the film was elongated at a fixed speed, using a computer-controlled system. In a metallized film, microcracking of the metal layer will result in an increase of its electrical resistance. FIG. 4 shows the change in resistance versus percent elongation for a control PP/aluminum film (Curve 54) and PP/plasma/aluminum (Curve 56). As can be seen, the aluminum deposited on the functionalized plasma-treated surface has significantly more microcracking resistance than the control.

2. PP/Plasma/Acryl/Al

The acrylate polymer was produced by electron beam curing of a tripropylene glycol diacrylate monomer film deposited in the vacuum using the experimental apparatus described in FIG. 1. The thickness of the acrylate polymer was about 1.0 μm thick. The PP film was first plasma-treated using a gas plasma produced by an $Ar/N_2$ gas mixture with a 10%/90% ratio, and the acrylate monomer was flash-evaporated on the treated surface. The acrylate polymer was applied below the aluminum layer to smooth out the rough surface of the PP film and to also provide a thermally and mechanically superior substrate. As shown in the capacitor section above, this results in higher corrosion stability of the aluminum layer. The structure is depicted in FIG. 3B.

In addition, the surface of the PP film contains low molecular weight material composed of PP, degraded PP, and slip agents added to the film during manufacture. It was discovered that these lower molecular weight species reflow when exposed to the heat generated from the evaporation sources and the condensation of the aluminum deposit. The reflow prevents nucleation of aluminum atoms on the surface of these cites, thus creating pinholes that degrade the moisture and oxygen barrier properties. This effect is eliminated or minimized when the high temperature acrylate polymer is deposited on the PP surface and then metallized.

3. PP/Plasma/Acryl/Al/Acryl/Plasma

The acrylate polymer was produced by electron beam curing of a tripropylene glycol diacrylate monomer film deposited in the vacuum using the experimental apparatus described in FIG. 1. The thickness of the acrylate polymer was about 1.0 μm thick. The PP film was first plasma-treated using a gas plasma produced by an $Ar/N_2$ gas mixture with a 10%/90% ratio, and the acrylate monomer was flash-evaporated on the treated surface. This is a combination of the two above systems. Other combinations with a second aluminum layer are also possible, but less cost effective. The structure is depicted in FIG. 3C.

In order to make the hybrid film production economically more attractive, lower grades of PP films (lower cost) may be used that when metallized have Oxygen Transmission Rates (OTR) in the range of 3 to 10, versus higher quality films that have OTRs in the range of 1 to 3. The data in Table VII below show that the OTR of control films (PP/Al) can be reduced from 6.17 to as low as 0.07 using the hybrid film designs described above. All OTR and MVTR barrier measurements reported herein were performed by a third party, using commercial equipment. Considering that the hybrid films can be produced in the same metallization equipment that the control films are made and with little additional cost, the OTR values of the hybrid films represents an unprecedented level of improvement, and are far superior to commercially available films.

TABLE VII

OXYGEN TRANSMISSION RATE (OTR) OF CONTROL METALLIZED PP (PP/Al) AND ACRYLATE-PP HYBRID FILMS

| FILM TYPE | OTR $cm^3/100\ in^2/day$ |
|---|---|
| PP/Al (control) | 6.17 |
| PP/plasma/Al/acryl/plasma | 0.59 |
| PP/plasma/acryl/Al | 2.54 |
| PP/plasma/acryl/Al/acryl/plasma | 0.07 |

It should be noted that the polypropylene was plasma-treated in the case that the acrylate polymer was deposited directly on the polypropylene (configurations 2 and 3 above). The plasma treatment was found to be advantageous for two reasons, (a) it removes adsorbed air and moisture from the surface of the PP film, which enhances the degree of cross-linking on the PP/acrylate interface, and (b) it functionalizes the PP film, which facilitates wetting of the acrylate monomer. Several gases were used for the plasma treatment operation that included Ar, $N_2$, $O_2$, Ne, $CO_2$, and mixtures thereof Ar and $N_2$ mixed in a 100%/90% ratio produced a very effective mixture as measured by wetting and uniformity of the polymer layer, and so did mixtures with 5% $O_2$. Another effective gas mixture incorporates 99.9% Ne and 0.1% Ar, and mixture of that with 10% $N_2$, or 5% of $O_2$, or 5% of $CO_2$. The long lived metastable levels in the Ne atom enhance the ionization level of the mixture and increase significantly the ionization current and surface treatment. Another effective mixture is 96% $CF_4$ and 4% $O_2$.

It was also found that at times, after the hybrid film was wound into a roll, a certain level of "blocking" or tackiness developed, because the back side of the polypropylene film had a soft copolymer layer deposited on it that is used to thermally seal the plastic bag. The tackiness was a result of the combined effect of partial cure on the surface of the acrylate coating and electrostatic charge (electrons) that can be trapped in deep and shallow potential wells in the acrylate coating.

It was found that the blocking could be eliminated with the addition of a second cross-linking and discharge station, after the acrylate polymer is formed in the first station. The second cross linking station can be another lower energy electron beam, or a plasma treatment station. An electron beam with 600 to 1200 eV energy was used to add surface cure and discharge the surface of the acrylate polymer. At this voltage level, most polymer materials have a secondary electron emission coefficient that is higher than 1.0, thus leading to a surface discharge, because for every incoming electron more than one electrons are emitted from the surface. A plasma treatment station accomplishes the same result, although the mechanism is different. The radiation in a plasma discharge includes ions and UV radiation. The UV radiation includes very energetic (15 eV) vacuum UV photons that enhance surface cross-linking, while the ions help discharge the film surface.

An alternate method of preventing blocking of the film in the roll is to use monomer formulations that include small quantities of additives such as monoacrylate monomers that cannot fully cross-link, or that are partially conductive. This leads to the formation of a "slippery" and/or antistatic acrylate surface that inhibits blocking and static charge formation.

B. Transparent Ceramic-Coated Barrier Films

Environmental constraints are leading to the replacement of certain chlorine-containing high barrier polymer films, with polyester films coated with transparent barrier layers of inorganic materials such as aluminum oxide and silicon oxides ($SiO_x$, where x=1 to 2).

Some food manufacturers have been slow in accepting the higher cost coated transparent barrier films due to the higher price of the polyester film that appears to be necessary for the production of transparent high barrier coatings. For this, several attempts have been made to produce lower cost transparent barrier using a polypropylene (PP) substrate films. This work has shown that the low melting point PP polymer films are in general a poor substrate for the deposition of the higher melting point inorganic coatings. Thus, ceramic-coated transparent barrier films that are presently in the market place utilize polyester film as a substrate that has superior thermomechanical properties to PP.

The present invention addresses the low cost production of high barrier metallized films as well as high barrier transparent PP films, using a combination of vacuum polymer coating and surface modification by plasma treatment. PP film was plasma-treated using a 90% $N_2$–10% Ar gas mixture and a low aroma acrylate monomer was deposited and cross-linked with electron beam radiation. The accelerating voltage is typically 10 to 12 KeV for about 1.0 μm of acrylate coating. The current (or number of electrons) varies with web speed. For a one foot wide web moving at 100 to 200 ft/min, 5 to 10 mA of current was used.

The transparent films employed in the practice of the present invention include aluminum oxide, silicon oxides ($SiO_x$, where x=1 to 2), tantalum oxide, aluminum nitride, titanium nitride, silicon nitride, silicon oxy-nitride, zinc oxide, indium oxide, and indium tin oxide. The thickness of the ceramic coating may range from about 5 to 100 nm for use as a barrier layer. Preferably, the best barrier properties are obtained in the lower portion of the thickness range. The ceramic coating may be deposited by electron beam evaporation.

Two types of transparent barrier films were produced; one using a thin inorganic film of $SiO_x$, where x=1 to 2, and $Al_2O_3$. The $SiO_x$ film was deposited using plasma deposition from a silane gas mixture and the $Al_2O_3$ film was deposited using electron beam evaporation. In this experiment, the objective was to see if the thermomechanically superior acrylate hybrid film had improved barrier properties, rather than optimizing the barrier properties to a minimum. The results as shown in Table VIII indicate that the oxygen and moisture barrier properties of the transparent PP/plasma/acrylate/ceramic film are superior to the control PP/ceramic film.

TABLE VIII

OXYGEN (OTR) AND MOISTURE (MVTR) TRANSMISSION RATE OF CONTROL PP/CERAMIC AND PP/PLASMA/ACRYLATE/CERAMIC HYBRID FILMS

| FILM TYPE | MVTR g/100 in²/day | OTR cm³/100 in²/day |
|---|---|---|
| PP/$SiO_x$ (control) | 0.25 | 9.2 |
| PP/$Al_2O_3$ (control) |  | 21.4 |
| PP/plasma/acryl/$SiO_x$ | 0.10 | 2.5 |
| PP/plasma/acryl/$Al_2O_3$ |  | 4.0 |

Figure 5:
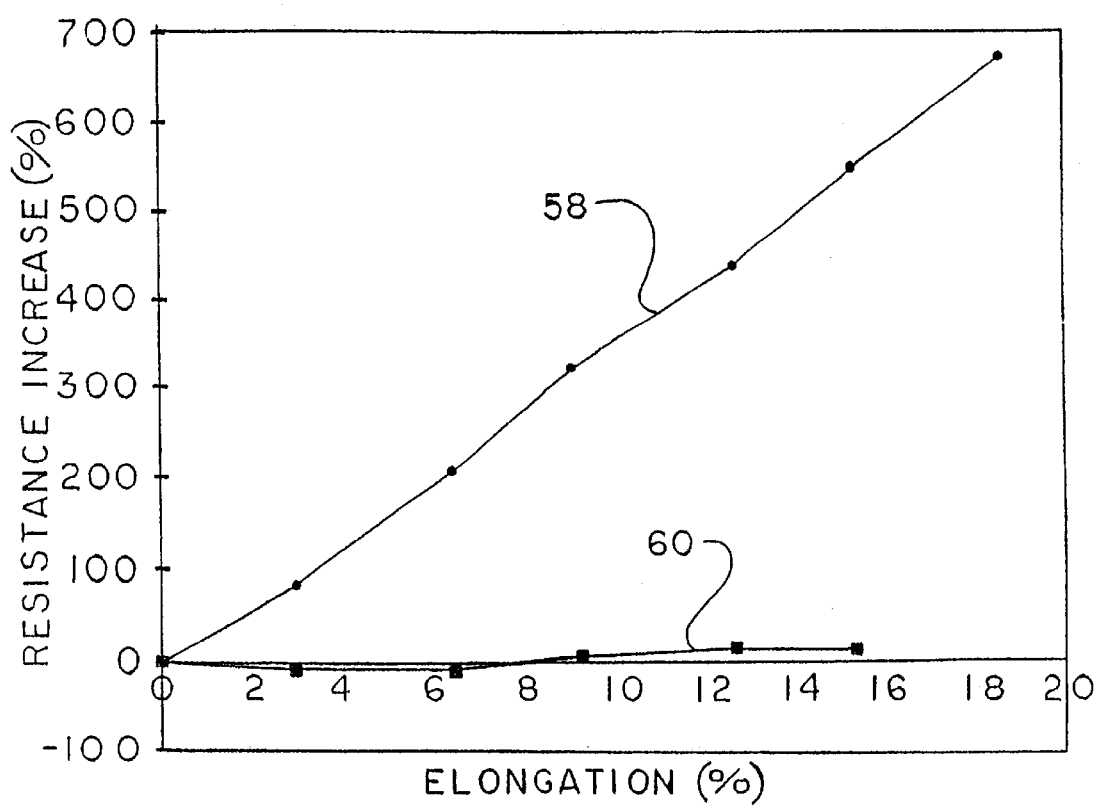
FIG. 5, on coordinates of increase in electrical resistance (in percent) and elongation (in percent), plots the electrical resistance increase as a function of elongation for an untreated metallized polymer film and for a metallized polymer film that is plasma-treated and coated.

In packaging applications, it is important that the barrier properties of a film are maintained through the process of processing the film into a bag. This process exposes the film to some elongation and stretching as the film is pulled over a forming collar is that forces the flat film to conform into a cylindrical opening that is sealed first on the side, then the bottom and on the top after food is automatically inserted in the bag. If conventional metallized PP film is elongated, then the aluminum layer can easily crack, leading to loss of barrier. Since barrier properties as a function of elongation is difficult to measure, the cracking of the aluminum as a function of elongation was measured indirectly by measuring the resistivity of the aluminum. FIG. 5 shows that the aluminum deposited on PP (Curve 58) has far inferior mechanical properties that of a PP/plasma/aluminum/acrylate/plasma hybrid film (Curve 60), using 90% $N_2$–10% Ar gas plasma and adhesion promoted deodorized tripropyleneglycol diacrylate monomer.

Further investigation on the structure of the aluminum using X-ray diffraction analysis, transmission electron microscopy, and electron diffraction analysis show that the aluminum formed on the control PP surface has large crystals, while aluminum deposited in the hybrid film has much finer crystal structure. Such crystal structure in combination with superior aluminum adhesion to the nitrided PP surface and the protective acrylate coating, minimize the formation of microcracks and preserve the original barrier properties of the film. Several packaging trials conducted by a leading manufacturer of snack foods have shown that bags produced with a monoweb of PP/plasma/aluminum/acrylate. The acrylate polymer was produced by electron beam curing of a tripropylene glycol diacrylate monomer film deposited in the vacuum using the experimental apparatus described in FIG. 1. The thickness of the acrylate polymer was about 1.0 μm thick. The PP film was first plasma-treated using a gas plasma produced by an Ar/$N_2$ gas mixture with a 10%/90% ratio, and aluminum was applied on top of the plasma-treated surface. The acrylate polymer was applied on top of the thin aluminum metal to prevent pinhole formation from abrasion of the film surface on rollers in the vacuum chamber and in subsequent processes such as slitting and laminating.

The hybrid film maintained low MVTR and OTR, while the control PP/Al film can increase by about an order of magnitude. Table IX shows OTR and MVTR data following film production, after printing and following bag production.

TABLE IX

OXYGEN (OTR) AND MOISTURE (MVTR) TRANSMISSION RATE OF PP/PLASMA/ALUMINUM/ACRYLATE/PLASMA HYBRID FILMS AT DIFFERENT PRODUCTION STAGES OF A SNACK FOOD BAG

| FILM TYPE PP/plasma/metal/acrylate/plasma | MVTR g/100 in²/day | OTR cm³/100 in²/day |
|---|---|---|
| Film Production | 0.004 | 0.34 |
| Printing | 0.003 | 0.35 |
| Bag Production | 0.01 | 1.41 |

III. Films for Printing Applications

In the above description of packaging applications, the PP/plasma/metal/acrylate/plasma hybrid film can be printed directly after production without any special preparations. The printing industry employs a broad range of printing inks that include three main categories; water-based, solvent-(oil) based, and 100% solids. Although these inks are formulate to wet different kinds of surfaces, surfaces are often formulated to be wetted by a particular ink process and equipment that a food manufacturer has in place. The acrylate hybrid films can be designed to be wetted by various ink chemistries. The hydrophilic/philic and oliophobic/philic surface wetting properties were measured using the solutions shown in Table X. A drop of each of the solutions in Table X was deposited on the surface of an acrylate polymer, obtained by electron beam curing of the acrylate monomer. If the liquid drop of a particular composition (1–6) does not wet the surface within the specified period (see foot notes in Table X), then the surface is considered phobic for that liquid.

TABLE X

SOLUTION CHEMISTRY USED FOR WETTABILITY TESTS, NUMBER "1" IS MOST PHILIC AND NUMBER "6" IS MOST PHOBIC

| Oil Rating Number | Composition |
| --- | --- |
| 1 | Kaydol (mineral oil) |
| 2 | 65/35 Kaydol/n-hexadecane |
| 3 | n-hexadecane |
| 4 | n-tetradecane |
| 5 | n-dodecane |
| 6 | n-decane |

30 seconds wetting period

| Water Rating Number | % iso-Propanol | % Water |
| --- | --- | --- |
| 1 | 2 | 98 |
| 2 | 5 | 95 |
| 3 | 10 | 90 |
| 4 | 20 | 80 |
| 5 | 30 | 70 |
| 6 | 40 | 60 |

10 seconds wetting period

Figure 6:
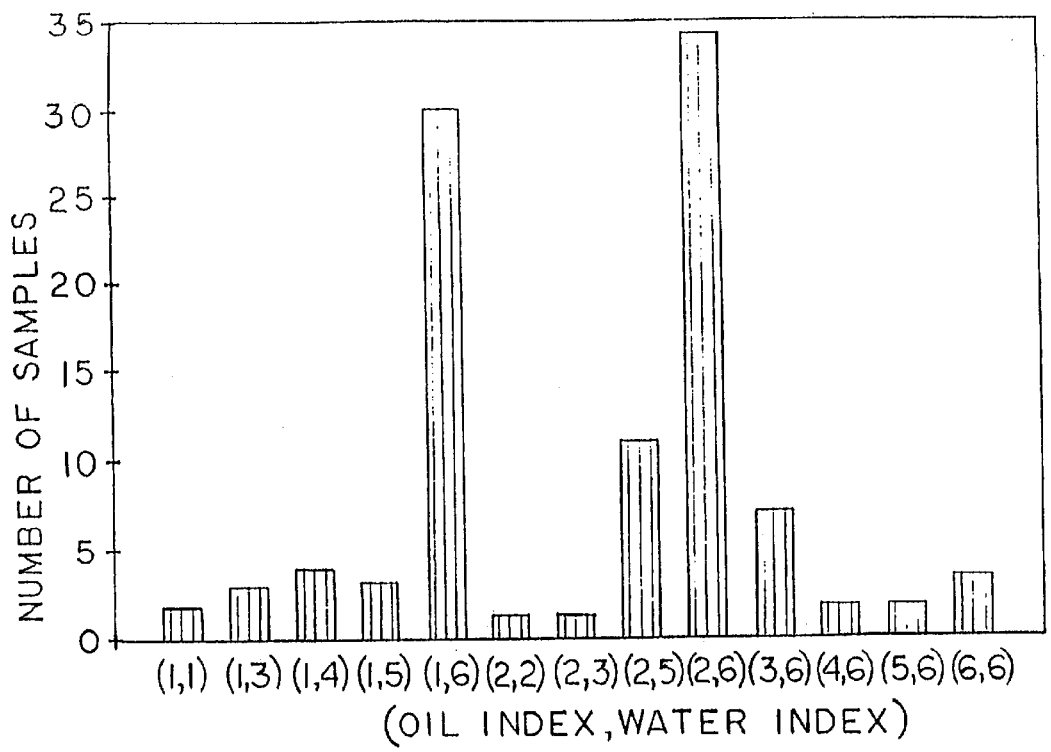
FIG. 6, on coordinates of number of samples and oil/water index, plots the extent of wetting by oil- and aqueous-based liquids on polymeric samples.

About 100 different acrylate formulations were produced and tested for basic wetting properties (see list under Capacitors, above). The results in FIG. 6 show that hybrid films can be formulated with specific surface wetting characteristics to accommodate a broad range of ink chemistries. Some examples of acrylate polymer formulations and their corresponding wetting properties are shown in Table XI.

TABLE XI

OIL AND WATER WETTING PROPERTIES OF ACRYLATE HYBRID FILMS (PP/plasma/Acrylate), SEE TABLE X FOR WETTING RATING NUMBERS.

| Oil | Water | Acrylate Polymer |
| --- | --- | --- |
| 1 | 6 | neo-pentyl glycol diacrylate |
| 5 | 6 | octyldecyl acrylate |
| 3 | 6 | octane diol diacrylate 1,8 |
| 3 | 4 | akoxylated aliphatic diacrylate ester |
| 3 | 6 | decanediol diacrylate |
| 1 | 3 | 93% hexane diol diacrylate/7% KENSTAT q100 |

Note:
KENSTAT q100 is a trade name of Kenrich Petrochemicals, Inc.

In addition to printing applications, the surface wetting functionalization of the PP/acrylate films can be useful in other applications where surface wetting or lack of it is important. For example, a Teflon-like surface that repels water can have many industrial and commercial applications. An oliophilic surface could be used in film/foil capacitor applications where the wound rolls have to be thoroughly impregnated with a dielectric oil-based fluid.

IV. Magnetic Tapes

The need for increasingly higher density storage media, the widespread use of narrow format video tapes, and the development of digital audio and video tape drives are leading to shorter wavelength recording, which allows higher data storage per unit length of tape. Such recording tapes utilize a thin metal magnetic coating that can be obtained by metal evaporation, sputtering and plating techniques. This approach eliminates the polymer binder that is utilized in conventional magnetic coatings resulting in ferromagnetic layers with higher saturation magnetization, which is suitable for higher storage densities.

When short wavelength recording is used, dropout or the loss of information is much higher for a given spacing between the recording medium and the magnetic head. The spacing loss is represented by the formula: 54.6 d/w, where d is the tape to head distance, and w is the recording wavelength. Therefore, if the surface of the magnetic medium, or even the opposite side are rough, loss of information will occur as the tape is running in front of the head. For this reason, films that are used for metallized magnetic tapes are quite costly because the surface roughness of both the front and the back surfaces have to be well-controlled to assure low degree of roughness. It should be noted that if the roughness of the back side is too low, then the tape can bind and be damaged.

An additional problem with thin metal tapes is damage of the magnetic due to abrasion resistance and environmental corrosion. Tape manufacturers have devised different ways of dealing with these limitations. Radiation-curable materials are commonly used to coat both the front and back surface of the substrate tape and often inorganic additives for controlled roughness and antistatic properties are used on the back side coating (U.S. Pat. Nos. 5,068,145; 4,670,340; 4,720,421 4,781,965; 4,812,351; 4,67,083; and 5,085,911). The existing methods for applying the radiation-curable coatings use conventional applications methods (roll coating, casting, and solution based) under atmospheric conditions, and the cure utilizes UV or electron beam, performed in air or in a nitrogen environment.

In the present invention, acrylate coatings are vapor-deposited in vacuum which allows for thinner, pinhole free and more uniform coatings, in-line with the deposition of the magnetic coating. Acrylate polymer films deposited on one surface of polyester film can flatten surface irregularities by one to two orders of magnitude, depending on the thickness of the acrylate layer. For example, a 2.0 $\mu$m acrylate coating on a surface with 400 nm asperities reduces the average surface roughness to less than 50 nm. The acrylate polymer was produced by electron beam curing of a hexane diol diacrylate monomer film deposited in the vacuum using the experimental apparatus described in FIG. 1. The substrate film was first plasma-treated using a gas plasma produced by an $Ar/N_2$ gas mixture with a 10%/90% ratio. If a flatter film is used with 50 nm asperities, then a 1.0 $\mu$m or less of hexane diol diacrylate acrylate layer results in a virtually flat film surface with a surface roughness of the order of 1 to 2 nm.

As mentioned above, a surface with a controlled roughness on the backside of the magnetic tape is often desirable to minimize friction over rollers. A hybrid film with a controlled microroughness was produced in the following manner. After the deposition of a radiation-curable monomer, an electron beam is used to polymerize the thin monomer film. For a film thickness of 1.0 $\mu$m, a beam with an accelerating voltage of about 8 to 12 KeV may be used. If the beam voltage is reduced considerably, the penetrating depth of the electrons is reduced proportionally. For example, an accelerating voltage of about 600 to 1000 electron volts will cure the surface of the acrylate film, thus creating a thin skin. The heat produced in the exothermic polymerization reaction and the shrinkage of the acrylate film during polymerization causes the skin to wrinkle in a very controlled way.

Figure 7A:
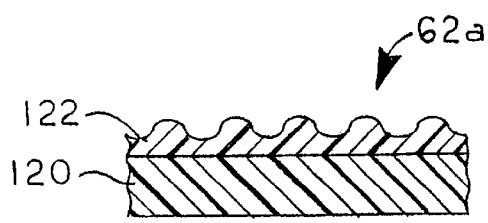
FIG. 7A is a cross-sectional view of an acrylate-coated polypropylene film in which the surface of the acrylate coating is micro-roughened.

A cross-section of the wrinkled surface 62a is shown in FIG. 7A. The periodicity and depth of the wrinkles can be controlled based on the thickness of the monomer film, accelerating voltage, current (number of electrons) and film shrinkage, that can be varied by changing the acrylate chemistry. Acrylate materials with film shrinkage greater than 5% are desirable for this process, with shrinkage levels of about 15% being preferable. Such monomers include materials such as pentaerythritol triacrylate, hexane diol diacrylate, trimethylolpropane triacrylate, pentaerythritol tetraacrylate, ditrimethylolpropane tetraacrylate, dipentaerythritol pentaacrylate, tripropylene glycol diacrylate and tetraethylene glycol diacrylate. After the production of the wrinkled surface, a second higher voltage electron beam is used to polymerize the whole monomer film thickness.

The reduced voltage may be obtained by placing a smaller electron beam gun 230, shown in phantom in FIG. 1, between the flash evaporator 28 and the radiation curing means 30.

The roughened surface 62a shown in FIG. 7A can be used in the backside of a magnetic tape to minimize abrasion and facilitate free movement over rollers. Such a surface may also be useful in film/foil capacitors to facilitate impregnation of capacitor rolls with a dielectric fluid.

V. Optical Filters

Polymer films with optical effects such as color shift and holographic images are used in various applications that include wrapping films and tamper proof and anti-counterfeiting medallions. Two such acrylate hybrid films were produced in a one-step low cost manufacturing process.

Figure 7B:
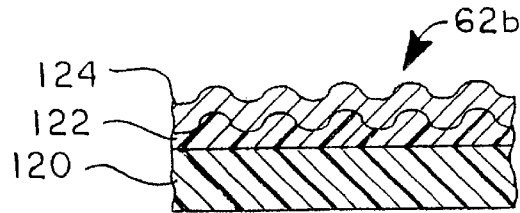
FIG. 7B is a cross-sectional view of the coated polymer film of FIG. 7A, following deposition of a thin metal layer on the micro-roughened surface of the acrylate coating.

(A) The wrinkled film described above, when metallized after the second electron beam cure (FIG. 7B), creates brilliant color shifting reflections if the wrinkles size is small enough to interfere with the ambient light. Although in this work only a uniform interference pattern was produced across the film surface, color shifting images can be produced by patterning the wrinkle area 62b and by varying the wrinkle size within an image. This can be accomplished by replacing the wide electron beam curtain with a single point electron beam that can be computer controlled to move in the X-Y axis and also have variable current by modulation of the Z axis.

Figure 8:
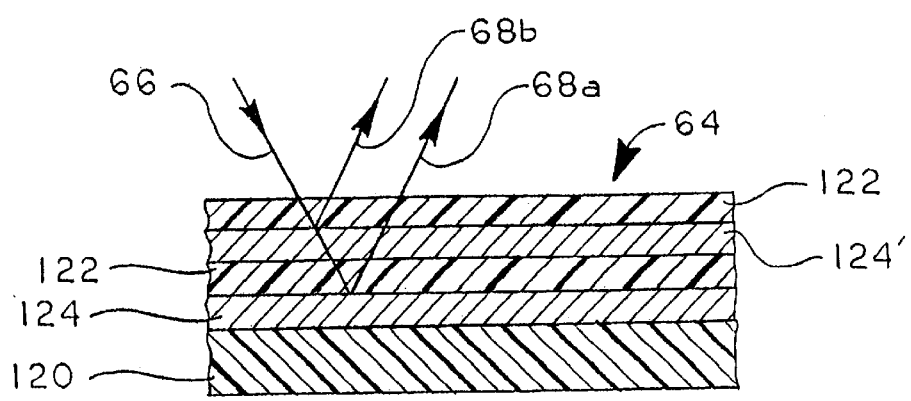
FIG. 8 is a cross-sectional view of the hybrid polymer film of the invention configured for optical filter applications.

(B) A uniform color shifting film 64 was produced using a relatively flat substrate film 120, or a relatively rough film that was flattened with an acrylate coating. The configuration of the color shifting film (shown in FIG. 8), was as follows: polyester/plasma/metal 1/acrylate 1/metal 2/acrylate 2/plasma. The acrylate polymer was produced by electron beam curing of a hexane diol diacrylate monomer film deposited in the vacuum using the experimental apparatus described in FIG. 1. The polyester substrate film was first plasma-treated using a gas plasma produced by an $Ar/N_2$ gas mixture with a 10%/90% ratio. Metal 1 was an aluminum film 124 that is highly reflective with an with an optical density of about 3 to 4. Acrylate 1 was a thin acrylate coating 122 with a thickness that was 1 wavelength of visible light (0.4 to 0.7 μm). Metal 2 was a thin semi-transparent layer 124' with optical density of about 0.5 to 1.5. Acrylate 2 is an optional protective coating 122' that can have any thickness (typically 0.5 to 3 μm) that provides adequate abrasion resistance. Such hybrid film results in a uniform bright color that shifts to higher or lower frequency color as the viewing angle changes.

Light beam 66 is incident on the color shifting device 64, and a portion passes through the semi-transparent metal layer 124' and is reflected as beam 68a by the opaque metal layer 124. Another portion of incident light beam 66 is reflected as beam 68b by the semi-transparent metal layer 124'.

The above color shift hybrid film could be made to color shift on both sides. That is, it could also color shift through the transparent polyester substrate film, if the color shifting stack is symmetrical. Such structure would be as follows: Polyester/semi-transparent aluminum/¼λ acrylate/reflective aluminum/¼λ acrylate/semi-transparent aluminum. Given the above hybrid film design, it will also be relatively easy to someone skilled in the art to produce a color shift pigment by releasing the color shifting stack from the polyester substrate. This can be accomplished by coating the polyester substrate with a layer of polystyrene. The color shifting stack is then deposited on the polystyrene, which can be dissolved in a solvent to produce symmetric color shifting flakes, that can be reduced to a finer color shifting pigment.

VI. Flexible Cables

In electrical cables, such as those used in aircraft to direct power to various parts of the airplane, arcing can occur that creates so-called "electrical tracking", which may result in fires. The use of these films in military aircraft has been banned by the U.S. Navy, and later the U.S. Army and Air Force, due to poor electrical tracking resistance that has resulted in several documented cases of fires, and even loss of military aircraft. One solution has been to replace the thermally and mechanically robust polyimide films that have poor tracking properties with polytetrafluoroethylene- ("Teflon") coated wire, which has excellent arc tracking properties. However, the Teflon coating is rather soft and it can be easily damaged. A solution to this problem is to clad Teflon on polyimide film (see Chemfab entry in Table XII, below). This hybrid film has tracking properties similar to Teflon, with superior thermal and mechanical properties.

In the present invention, reduction of electrical tracking is accomplished with the use of a hybrid film that utilizes a combination of a Teflon-like vacuum polymer coating and surface modification by plasma treatment. An electrical arc tracking test was developed to simulate the performance of cable insulation. A high voltage, high impedance AC voltage (5 to 15 KV), was applied between two flat metal plates that were 5 inches long, 2 inches wide and 1/16 inch thick. The test samples (in the form of 1 to 6 mil thick films) were wrapped around the plates and the two plates were fixtured against each other along their length on one plane. The gap between the plates was is adjusted to about 1 mm and the voltage was raised until an arc initiated at one of the two opposing sets of corners in the two plates that was intentionally exposed (not covered with the test films) to allow the arc to strike. The polymer films start to burn as soon as the arc strikes. The rate of arc movement (film burning) accurately replicates the ability of the material to arc-track. The system was tested using known materials such as Teflon and Kapton films that have low and high arc tracking rates, respectively.

TABLE XII

ARC TRACKING RESISTANCE OF SEVERAL POLYMER FILMS

| FILM | LAYERS/ THICKNESS | TRACKING DISTANCE (inch) |
| --- | --- | --- |
| PBO/Fluoroacrylate, 12 μm | 4/1 mil | no arc |
| PTFE | 4/1 mil | <1/32 |
| Chemfab, Style 072992A | 2/2 mil | <1/32 |
| Polyester (PET) | 8/0.5 mil | <1/32 |
| Polypropylene (PP) | 8/0.5 mil | 4/32 |
| Kapton/Fluoroacrylate, 12 μm | 4/1 mil | 4/32 |
| ETFE (Tefzel film) | 4/1 mil | 12/32 |
| PFCB | 2/0.8 mil (best of 3) | 30/32 |
| PIBO | 4/1 mil | 32/32 |

TABLE XII-continued

ARC TRACKING RESISTANCE OF
SEVERAL POLYMER FILMS

| FILM | LAYERS/ THICKNESS | TRACKING DISTANCE (inch) |
|---|---|---|
| Polycarbonate (PC) | 8/0.5 mil | 40/32 |
| PBO | 4/1 mil | 60/32 |
| Kapton | 2/2 mil | 60/32 |

A functionally similar hybrid film was produced by depositing a fluorine-containing acrylate film on one or both sides of Kapton (DuPont film) and PBO (Dow Chemical film). Table XII shows a clear relationship between the thickness of a fluoroacrylate coating on 25 $\mu$m of PBO and Kapton films. The fluoroacrylate coating was composed of a 25%:75% mixture of hexane diol diacrylate (HDODA):perfluoroalkysulfonamide, and then cross-linked with an electron beam, using the apparatus described in FIG. 1. For the PBO-coated films, the improvement in arc tracking paralleled the coating thickness until a critical thickness of about 12 $\mu$m was reached. Beyond that point, the tracking resistance was equal to that of PTFE. At 23 $\mu$m of coating thickness, it was not possible to strike a sustainable arc, thus giving an apparent arc tracking resistance better than that of PTFE. Table XIII shows tracking resistance of is the 12 $\mu$m coated PBO and Kapton films, along with several other commercial films, that were tested under the same conditions, and are included as benchmarks to provide a comparison means for the arc tracking performance of the fluoroacrylate coatings.

TABLE XIII

ARC TRACKING DISTANCE OF FLUOROACRYLATE-
COATED PBO AND KAPTON FILMS

| BASE FILM | FLUOROACRYLATE COATING THICKNESS | DISTANCE ARC TRAVELED (inch) |
|---|---|---|
| PBO | none | 60/32 |
| PBO | 6 $\mu$m | 44/32 |
| PBO | 9.5 $\mu$m | 32/32 |
| PRO | 12 $\mu$m | <1/32 |
| PRO | 23 $\mu$m | <1/32 |
| Kapton | 10 $\mu$m | 40/32 |
| Kapton | 12 $\mu$m | 4/32 |

INDUSTRIAL APPLICABILITY

The hybrid polymer films comprising a polymer film, a plasma-treated surface, a vacuum-deposited, radiation-curable acrylate polymer with a plasma-treated surface, are expected to find a variety of uses in food packaging films, thin film metallized and foil capacitors, flexible electrical cables, metal evaporated magnetic tapes, optically variable films, and other applications that utilize films such as PP and PET.

While certain embodiments of the present invention have been disclosed herein, it will be readily apparent to those skilled in this art that various changes and modifications of an obvious nature may be made, and all such changes and modifications are considered to fall within the scope of the invention as defined by the appended claims.

What is claimed is:

1. A barrier film for limiting transmission of oxygen and moisture therethrough comprising:
    (a) a polymer substrate having a first vacuum-formed plasma-treated surface;
    (b) a first metal layer having first and second surfaces, the first surface of the first metal layer being disposed on the plasma-treated surface of the polymer substrate; and
    (c) a vacuum-deposited, first radiation-polymerized acrylate monomer film having first and second surfaces, the second surface of the first polymerized firm being disposed on the first surface of the first metal layer;
    wherein the second surface of the first polymerized film is a vacuum-formed plasma-treated surface.

2. The barrier film of claim 1, wherein the polymer substrate is formed from a thermoplastic polymer.

3. The barrier film of claim 1, wherein the polymer substrate is formed from a thermoset polymer.

4. The barrier film of claim 1, wherein the first metal layer is formed from a material selected from the group consisting of aluminum, zinc, nickel, cobalt, iron, iron on aluminum, zinc on silver, zinc on copper, zinc on aluminum, nickel-cobalt alloy, and nickel-cobalt-iron alloy.

5. The barrier film of claim 1, further comprising
    (d) a second metal layer having first and second surfaces, the first surface of the second metal layer being disposed on the second surface of the first polymerized film; and
    (e) a vacuum-deposited, second radiation-polymerized acrylate monomer film having first and second surfaces, the first surface of the second polymerized film being disposed on the second surface of the second metal layer.

6. The barrier film of claim 5, wherein the second surface of the second polymerized film is a plasma-treated surface.

7. The barrier film of claim 5 wherein the second metal layer is formed from a material selected from the group consisting of aluminum, zinc, nickel, cobalt, iron, iron on aluminum, zinc on silver, zinc on copper, zinc on aluminum, nickel-cobalt alloy, and nickel-cobalt-iron alloy, independent of the first metal layer.

8. A barrier film for limiting transmission of oxygen and moisture therethrough comprising:
    (a) a polymer substrate having a first vacuum-formed plasma-treated surface;
    (b) a vacuum-deposited, first radiation-polymerized acrylate monomer film having first and second surfaces, the first surface of the first polymerized-film being disposed on the first plasma-treated surface of the polymer substrate; and
    (c) an inorganic layer having first and second surfaces, the first surface of the inorganic layer being disposed on the second surface of the first polymerized film;
    wherein the second surface of the first polymerized film is a vacuum-formed plasma-treated surface.

9. The barrier film of claim 8, wherein the polymer substrate is formed from a thermoplastic polymer.

10. The barrier film of claim 8, wherein the polymer substrate is formed from a thermoset polymer.

11. The barrier film of claim 8, wherein the inorganic layer comprises a material selected from the group consisting of aluminum, zinc, nickel, cobalt, iron, iron on aluminum, zinc on silver, zinc on copper, zinc on aluminum, nickel-cobalt alloy, nickel-cobalt-iron alloy, a silicon oxide, tantalum oxide, aluminum nitride, silicon nitride, silicon oxy-nitride, zinc oxide, indium oxide, and indium tin oxide.

12. The barrier film of claim 11, wherein the inorganic layer comprises a material selected from the group consisting of aluminum oxide and a silicon oxide.

13. A barrier film for limiting transmission of oxygen and moisture therethrough comprising:

(a) a polymer substrate having a first vacuum-formed plasma-treated surface;
(b) a vacuum-deposited, first radiation-polymerized acrylate monomer film having first and second surfaces, the first surface of the first polymerized-film being disposed on the first plasma-treated surface of the polymer substrate;
(c) a first metal layer having first and second surfaces, the first surface of the first metal layer being disposed on the second surface of the first polymerized film; and
(d) a vacuum-deposited, second radiation-polymerized acrylate monomer film having first and second surfaces, the first surface of the second polymerized film being disposed on the second surface of the first metal layer;
wherein the second surface of the first polymerized film is a vacuum-formed plasma-treated surface.

14. The barrier film of claim 13, wherein the polymer substrate is formed from a thermoplastic polymer.

15. The barrier film of claim 13, wherein the polymer substrate is formed from a thermoset polymer.

16. The barrier film of claim 13, wherein the first metal layer is formed from a material selected from the group consisting of aluminum, zinc, nickel, cobalt, iron, iron on aluminum, zinc on silver, zinc on copper, zinc on aluminum, nickel-cobalt alloy, and nickel-cobalt-iron alloy.

17. A barrier film for limiting transmission of oxygen and moisture therethrough comprising:
(a) a polymer substrate having first and second plasma-treated surfaces,
(b) a vacuum-deposited, radiation-polymerized acrylate monomer film disposed on each of the first and second plasma-treated surfaces of the polymer substrate; and
(c) a metal layer disposed on at least one vacuum-deposited, radiation polymerized acrylate monomer film.

* * * * *